(12) United States Patent
Petrescu-Prahova

(10) Patent No.: US 8,023,548 B2
(45) Date of Patent: Sep. 20, 2011

(54) DIODE LASERS TYPE OF DEVICES WITH GOOD COUPLING BETWEEN FIELD DISTRIBUTION AND GAIN

(76) Inventor: Iulian Basarab Petrescu-Prahova, North Brunswick, NJ (US)

( * ) Notice: Subject to any disclaimer, the term of this patent is extended or adjusted under 35 U.S.C. 154(b) by 0 days.

(21) Appl. No.: 11/893,223

(22) Filed: Aug. 15, 2007

(65) Prior Publication Data

US 2009/0046753 A1 Feb. 19, 2009

(51) Int. Cl.
*H01S 5/00* (2006.01)
(52) U.S. Cl. ........... 372/50.12; 372/50.1; 372/19; 372/9
(58) Field of Classification Search ............... 372/50.12, 372/50.1, 19, 9
See application file for complete search history.

(56) References Cited

U.S. PATENT DOCUMENTS

| | | | | |
|---|---|---|---|---|
| 4,985,897 A | * | 1/1991 | Botez et al. | 372/50.12 |
| 5,091,757 A | | 2/1992 | Yoshida | |
| 6,167,073 A | * | 12/2000 | Botez et al. | 372/46.01 |
| 6,330,388 B1 | * | 12/2001 | Bendett et al. | 385/132 |

* cited by examiner

*Primary Examiner* — Jessica T Stultz
*Assistant Examiner* — Kinam Park
(74) *Attorney, Agent, or Firm* — Thomas R. Vigil

(57) ABSTRACT

Diode lasers type of devices with good coupling between field distribution and gain are disclosed. A single element has a flat field distribution that couples with the uniform current injection in a contact region. A multi element array having almost flat field distribution in each element and almost equal amplitude for the field intensity in all elements is provided. Injection by multiple contacts couples well with the overall field distribution. Also, the lasers are stable against filament formation and mode switching.

3 Claims, 24 Drawing Sheets

Modulus of the next to basic mode field distribution for a structure with reflecting filters Modulus of the field distribution for the first order mode for a structure with adjusted attenuators Modulus of the basic mode field distribution for a structure with reflecting-filters, with depressed effective refractive index in the main segment and with simulated thermal effect in the main segment Modulus of the basic mode field distribution for a ten element array with reflecting filters, in-phase coupling inter-elements and with adjusted width end elements Field distribution for the out of phase mode of a ten element array with reflecting -filters, in-phase coupling inter-elements and with adjusted width end elements Modulus of the field distribution of the basic mode for ten elements array with high contrast (Li,Hi) pairs (right side)

ns and patents. In this application applicant addresses an improvement that will affect the operation of both single elements and arrays, both emitters and amplifiers.
DIODE LASERS TYPE OF DEVICES WITH GOOD COUPLING BETWEEN FIELD DISTRIBUTION AND GAIN

BACKGROUND OF THE INVENTION

1. Field of the Invention

The invention relates to improved field distribution in a single element diode laser and in arrays of diode lasers.

2. Description of the Prior Art

Diode laser type of devices, single elements and arrays, emitters and amplifiers, have a long history of continuous developments, many of them documented in patent applications and patents. In this application applicant addresses an improvement that will affect the operation of both single elements and arrays, both emitters and amplifiers.

Most of the single elements are stripe diode lasers, wherein the excited active region seen from the top of the diode laser chip is rectangular in shape. If the active stripe is narrow enough these lasers can operate in a single lateral mode. There are known many structures with stripe geometry. Presently, the most used structures are the etched ridge stripe structures and buried stripe structures. An older type of structure is the gain-guided structure. Among more sophisticated structures reference is made to the lateral ARROW (Anti Resonant Reflecting Optical Wave-guide) structure. If multiple stripes are formed and operate together they form the elements of an array.

All mentioned devices have a lateral structure that comprises a multitude of lateral segments, each of them having similar epitaxial structures.

The ridge structure operates based on a real and positive difference in the effective refractive index in the lateral direction from the ridge-segment to the surrounding segments. Etching part of the surrounding segments top claddings, reduces the effective refractive index in these segments compared with that in non-etched core segment.

The buried structure operates also with a positive difference in the effective refractive index in the lateral direction from the buried segment to the surrounding segments. This difference can be induced by an etch regrowth process. The top cladding in the surrounding segments is etched down and through the active region and the etched material is replaced by regrowth with a material with a lower refractive index than the etched material. When the etching process does not reach the active region a ridge-buried structure is formed.

In the lateral effective refractive index profile, both these structures have a protuberance corresponding to the core segment extent and the radiation is index-guided. In this type of refractive index profile the radiation is confined in the core segment and evanescently decays in the surrounding segments with a lower effective refractive index than that in the core segment. These single element structures are laterally single mode if only the mode with a field distribution with no zero is allowed or it has enhanced favorable conditions for operation. In this case the field distribution in the core segment is almost a half cosine.

The lateral ARROW type of structure confines the radiation into the core segment by reflections from lateral sequences of sub-segments situated in both lateral directions. The first of these sub-segments has the effective refractive index higher than that of the core segment. The second is usually of the same effective refractive index as the core segment. The outside radiation decay is oscillatory and can be controlled by the effective refractive indexed of the lateral segments and by their widths, i.e., by the relation of these widths to each segment lateral wavelength $\Lambda_i$. Normally, each segment i in each lateral sequence has a width equal to an odd multiple of $\Lambda_i/4$. The core segment width is $\Lambda_c/2$. Each lateral sequence acts as an interference cladding. The field distribution in the core segment is a half cosine.

In a coupled array, active segments are coupled and operate together. They form the elements of the array. The segments between elements form the inter-elements. The exact kind of radiation coupling between elements determines a multitude of field distributions that differ from one to another, the super-modes.

To avoid further confusions, it is recalled that the field in any point is a phasor that has amplitude A and phase $\phi$ and is described by a complex number $E=A \exp(i\phi)$. The field intensity I is considered as the square of the field $I=|E|^2$.

There are two super-modes of interest for applications: the in-phase super-mode and the out-of-phase super-mode. The array design can be done to favor only one of these two modes and to discriminate all other modes. The favored mode will be called in this text the "preferred" mode. In the near field, the in-phase mode has all main peaks with the same phase. Due to wavy part of the near field, the far field has one main peak in the direction of the symmetry axis, perpendicular to the array facet, and a few lateral peaks, on both side of the main peak, whose mere existence reduce the brightness of the main peak. The out-of-phase mode has a near field distribution that is closer to a sine function if intensity of all element peaks has equal amplitude. The far field corresponding to such a near field has two symmetric lateral peaks where most of the exit power is concentrated. With external optics one peak can be returned into laser oscillators and amplifiers and all radiation to be emitted into only one, high brightness peak, whose direction is at an angle from the symmetry axis.

There are two types of coupling: evanescent coupling and leaky wave coupling. Arrays with evanescent coupling have multiple protuberances in the effective refractive index profile, one corresponding to each element. These arrays usually operate in the super-mode in which the radiation field in each element is out of phase (also named in anti-phase) with the radiation in adjacent elements, since this super-mode has highest confinement factor and has also the lowest attenuation.

Arrays with leaky wave coupling have protuberances corresponding to each inter-element extent, i.e., the inter-element effective refractive index is higher than element effective refractive index. The radiation distribution in each element can be arranged to be in phase with each other, if inter-element widths are equal to an odd number of its corresponding half lateral wavelength and the element width is half of its corresponding lateral wavelength. Unfortunately the inter-element wavelength is shorter than the element wavelength, due to their differences in effective refractive indexes, and elements are spatially crowded if inter-elements width are only one half wavelength. These arrays had also presented near field patterns that were unequal from element to element, with a cosine shape envelope.

The field distribution in arrays of both types of devices comprises a number of alternating peaks whose intensities usually have a cosine envelope.

The structures for lateral single mode operation mentioned above have the disadvantage that the extension of the field distribution in the active core segment is a half cosine or almost equal to a half cosine. These distributions do not best couple with the shape of the core segment excitation distribution, induced by a current under a contact, excitation distribution that is almost flat under the contact. The inefficient coupling increases the threshold current and reduces the slope efficiency. The threshold current is increased since the overlap of the mode field distribution to the active segments does not have its maximum possible value. The slope efficiency is reduced since, as the Fermi level difference continues to slightly increase after threshold, this extra pumping is not used for power extraction in regions where the field distribution is low. Another disadvantage is that the curvature of the field distribution helps the triggering of the filament formation.

Both types of arrays have the disadvantage that field intensity distributions have a cosine envelope that does not couple well with the uniform excitation distribution from one element to the other. The leaky wave arrays mentioned above have the disadvantage that elements are crowded One disadvantage of arrays, designed to have as the preferred mode either the in-phase mode or out-of-phase mode is that there are adjacent modes that have relative modal gain close to the modal gain of the preferred mode. If the preferred mode is not discriminated enough, there is a greater possibility for mode switching to non-preferred modes at the beginning or during operation.

The boundary conditions are critical for shaping the field distribution in single element and multiple elements (arrays) diode laser. It is one object of this invention to provide lateral boundary conditions for single element or arrays diode lasers.

It is also an object of this invention to provide, by design, a single element structure with such boundary conditions that the field distribution in the excited segments is essentially flat. However, for special reasons, by design, the field distribution can be also part of a cosine (convex) or, especially, part of a hyperbolic-cosine (concave) function.

It is another object of this invention to provide arrays with flat field distributions in each element and with equal field amplitudes from element to element.

It is another object of this invention to provide a less restrictive array with array boundaries that assures for the preferred mode that is the out-of-phase mode equal peak field intensity for all elements of array, i. e a flat envelope for the field intensity distribution, but not flat field in each element.

SUMMARY OF THE INVENTION

The diode laser type of device with single elements and arrays constructed according to the teachings of the present invention comprises a lateral structure that is formed by a multitude of lateral segments. In the transversal direction each segment comprises a transversal structure of a multitude of layers. The segments' transversal layer structures are similar one to the other from the point of view of the distribution of the radiation field in the transversal direction, having overlapping coefficients close to one and effective refractive indexes for the propagation in the longitudinal direction close to each other. Nevertheless, to reduce the associated processing difficulties, the number of different types of transversal structures should be kept to a minimum. Some segments may contain an active region in the transversal layer structure and the active region generates laser radiation when is electrically excited or absorb the laser radiation when is not electrically excited.

One type of single element structure of segments comprises the following segment systems:

a main segment that contain the active region that can be electrically excited and has the role of generating the laser radiation that extends in the whole lateral segments' structure when the active region is excited;

reflecting-filter systems of segments, located on each side of the main segment, having the role to connect the main segment with the margin segments, the role to reflect back toward the main segment the radiation penetrating laterally from the main segment and the role to assists the lateral mode selection by a reflection that is sensitive to lateral modes, being lower for the un-preferred lateral modes; it is beneficial that the reflecting-filter system of segments is as transparent as possible for the laser radiation;

margin segments, located externally to the reflecting-filter systems of segments, that have the role to induce the decay of the laser radiation toward the exterior of the lateral segment structure; they may have an active region not electrically excited that absorb the laser radiation.

The segment structure is designed to accept as a preferred lateral field distribution in the main segment, a distribution that has no zero in the main segment and has an essentially flat radiation field distribution. For special reasons the segment structure can be designed to have a quasi-flat field distribution either convex (small part of a cosine) or concave (small part of a hyperbolic cosine).

The segment structure of an array with flat field distribution in each element according to the teachings of the invention has a multitude of main segments and include also inter-elements between elements, inter-elements that are formed of segment systems that allow a symmetric or anti-symmetric field distribution in the inter-element regions with zero slopes at the inter-element region margins and have the role to couple in phase or out of phase the adjacent elements that have flat field distribution One type of a less restrictive array with flat envelope for the field distribution, but without flat field in each element, comprises the following system of segments:

a multitude of element segments that contain the active region that can be electrically excited and have the role of generating the laser radiation that extend in the whole lateral segment structure when the active region is excited;

a multitude of inter-element system of segments situated between each adjacent element pair; the inter-elements have the role to couple in anti-phase the field distribution in one element with the field distribution in an adjacent element;

elements and inter-elements that form a full periodic structure, a period comprising an element in its center and two halves of inter-element segments on each side of the element;

reflecting-filter system of segments, located on each side of the array, having the role to reflect back the radiation coming from the array in such a way that nodes are pinned at the array ends.

BRIEF DESCRIPTION OF THE DRAWINGS

In the attached figures, other features of the laser type of devices according to the teachings of the present invention will become apparent from the specific examples, wherein.

DETAILED DESCRIPTION OF THE PREFERRED EMBODIMENTS

Figure 1:
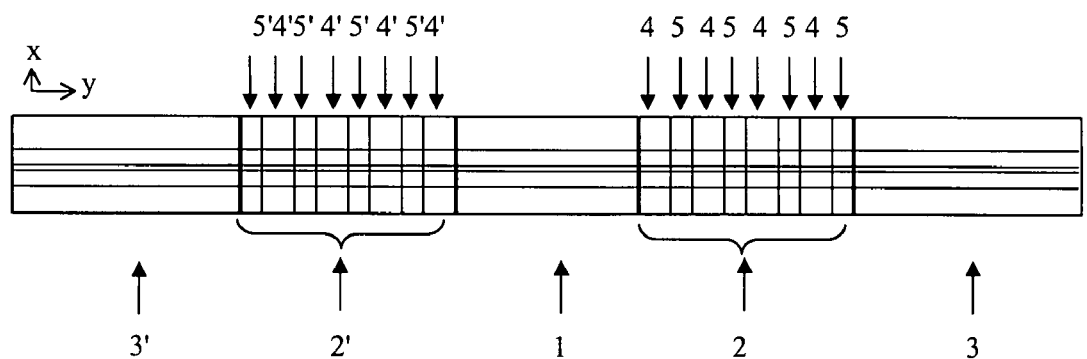
FIG. 1 is a layout of a segment structure of a diode laser with reflecting filters.

Diode lasers and arrays are formed in an epitaxial structure grown on a substrate. After processing they are cleaved to form bars. Bars are cut into chips that form the individual devices.

The main direction of propagation is between the cleaved faces. This defines a longitudinal direction, named here the z direction.

Perpendicular to the substrate there is a transversal direction, named here the x direction. In the transversal direction, the main regions of a diode laser structure are the active region and two surrounding cladding regions. The cladding regions materials have a lower refractive index than the active region material, an arrangement that confines the radiation between claddings, with an evanescent decay in the claddings. Usually in the transversal direction the refractive indexes of the epitaxial structure and the thickness of the structure between claddings are chosen in such a way that only the fundamental transversal mode is allowed or this is the only one that has favorable condition for propagation. A transversal mode for a laterally infinite transversal structure is characterized by a transversal mode refractive index n (further also named effective refractive index) and by a transversal field distribution E(x).

The direction perpendicular on xz plane, defines a lateral direction, the y direction. When processing the wafer, slight modifications of the structure in lateral direction are induced. In this way, in the lateral direction, a succession of segments having rather similar epitaxial structures is formed. Each segment i has it's own transversal field distribution $E_i(x)$ and its own transversal mode effective refractive index $n_i$. The refractive index $n_i$ determines the phase velocity of the transversal mode in the longitudinal direction. In the convention used in this text, the imaginary part for gain is negative. These different transversal mode effective refractive indexes form an effective refractive index profile n(y) also named a lateral optical structure. The properties of the lateral propagation, described by a lateral field distribution E(y), is determined by the lateral profile of the effective refractive indexes n(y).

The method of studying the radiation propagation in an epitaxial structure with slightly different segments using the effective index for each segment is named the effective index method. It is an approximate method but very useful in guiding design and in helping explanations. This is the method used in this text.

In the effective refractive index approximation the lateral field distribution E(y) satisfies a Schroedinger type of equation:

$$\delta^2 E / \delta y^2 + (2\pi/\lambda)^2 [n(y)^2 - n^2] E = 0 \quad (1)$$

$\lambda$ is the wavelength in the free space.
Each possible solution for this equation determines a lateral mode, or a super-mode in the case of arrays. A mode (or super-mode) has a modal refractive index $n=n_m$ and a lateral field distribution $E(y)=E_m(y)$.

The lateral propagation in each segment i can be characterized by a lateral wavelength $\Lambda_i$. Each lateral wavelength $\Lambda_i$ is determined by the lateral modal refractive index $n_m$ and the effective refractive index of each segment $n_i$ by a relation:

$$\Lambda_i = \lambda / \mathrm{sqrt}\, (n_i^2 - n_m^2) \quad (2)$$

One concept of the present invention is that among the possible solutions of equation (1), if proper arrangements are made, there are solutions with $E_m$=constant in the active segments. Let $n_a$ be the effective refractive index in the main active segment. The solution with $E_m$=constant in the active segment requires the condition:

$$n_m = n_a \text{ or } \Lambda_a = \infty: \quad (3)$$

$\Lambda_a = \infty$: signifies that the field is flat in the active segment.

For modeling structures in which the preferred mode has a flat field distribution in the main segment and $n_a = n_m$, the lateral wavelengths will be calculated relative to $n_a$ instead of $n_m$, more specifically to the real part of $n_a$. The $n_a$.real value, relative to which all lateral wavelengths are calculated for design is a reference value.

First there are presented examples for single element diode lasers and for arrays, constructed from epitaxial structures with lateral segments each having effective refractive index values between 2.9 and 3.6, but paying attention only to the lateral segment structure. The mentioned values are believed to cover all semiconductor materials and epitaxial structures used for diode lasers.

Next are presented examples of epitaxial structures, which have values for their effective refractive index similar to that in the first examples, and the processing steps necessary to alter these epitaxial structures and their effective refractive index in order to obtain the designed lateral segment structures and the corresponding effective refractive index profile.

The First Example

Flat Field Distribution in a Single Element Structure with Reflecting-Filters

Figure 2:
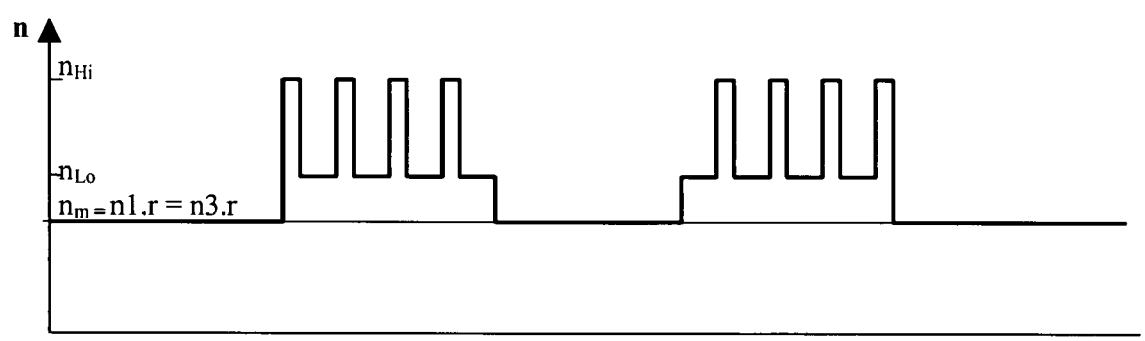
FIG. 2 is a graph of an effective refractive index profile for the structure with reflecting filters.

This diode laser is a single element diode laser with two lateral reflecting-filters. This diode laser is presented in FIG. 1. The real part of the effective refractive index profile is given in FIG. 2. The constructive parameters for this diode laser are given in Table 1. The constructive parameters are given for an emission wavelength $\lambda = 1$ μm.

The diode laser comprises a main active segment 1, two systems of segments that form the reflecting-filters 2 and 2', adjacent to both sides of the main segment, and two margin segments 3 and 3', each externally adjacent to its corresponding reflecting filter. The segment systems for the reflecting filters comprise sub-segments (4, 5) and (4', 5').

The active segment has a complex effective refractive index $n_1$. $n_1 = n_1.\mathrm{real} + n_1.\mathrm{imag} \times i$. The imaginary part of $n_1$, $n_1.\mathrm{imag}$, accounts for the gain in the main segment.

The segment system for a reflecting filter comprises two types of sub-segments: sub-segments 4 and 4', with an effective refractive index $n_{Lo}$, and sub-segments 5 and 5', with an effective refractive index $n_{Hi}$. These sub-segments are also named Lo and Hi. Preferably the reflecting filters are transparent to reduce losses. In this case the effective refractive indexes are real numbers. The value of $n_{Lo}$ is lower than the value of $n_{Hi}$. These values are both greater than the real part of the effective refractive index value for the main segment and than the real part of the modal refractive index. The field distributions in these sub-segments are parts of cosine functions.

The margin segments 3 and 3' have complex effective refractive indexes $n_3$. $n_3 = n_3.\mathrm{real} + n_3.\mathrm{imag} \times i$. The imaginary part of $n_3$, $n_3.\mathrm{imag}$, accounts for the absorption in the margin segments.

It was stated that the preferred solution for the field distribution is flat in the main active segment 1. This preferred field distribution is named the basic mode. It has no zero in the main segment, as the fundamental mode for an index-guided segment the field distribution do. However it has zeros outside the main segment.

The main active segment has a width, w1. A reasonable value for w1 is not restricted to the usual values for segments in single mode devices. It might be greater than in usual single mode devices since the lack of curvature in the field distribution avoids or delays the filament formation.

The sub-segments 4, 4' have widths $w_{Lo}$ related to their corresponding effective refractive index $n_{Lo}$ and to their lateral wavelength $\Lambda_{Lo}$. $\Lambda_{Lo}$ is equal to $\lambda/\mathrm{sqrt}\,(n_{Lo}^2 - n_1.\mathrm{real}^2)$. $w_{Lo}$ is a quarter wavelength:

$$w_{Lo} = \Lambda_{Lo}/4 = \lambda/(4\mathrm{sqrt}((n_{Lo}^2 - n_1.\mathrm{real}^2))) \quad (4)$$

The reduced width, $w_{Lo}/\Lambda_{Lo}$, is ¼.

The sub-segments 5, 5' have widths $w_{Hi}$ related to their corresponding effective refractive index $n_{Hi}$ and to their lateral wavelength $\Lambda_{Hi}$. $\Lambda_{Hi}$ is equal to $\lambda/\mathrm{sqrt}\,(n_{Hi}^2 - n_1.\mathrm{real}^2)$. $w_{Hi}$ is a quarter wavelength:

$$w_{Hi} = \Lambda_{Hi}/4 = 1/(4\mathrm{sqrt}\,(n_{Hi}^2 - n_1.\mathrm{real}^2)) \quad (5)$$

The reduced width, $w_{Hi}/\Lambda_{Hi}$, is ¼.

Starting from the main segment 1 the reflecting filter sub-segments are arranged in the order (Lo, Hi), (Lo, Hi) etc. The cosine field distribution in the first sub-segment Lo has the role to connect the flat field distribution in the active segment to the next Hi sub-segment. The transition between Lo and Hi is at a zero value for the field distribution. The field distribution in the first Hi sub-segment ends at the cosine maximum (in absolute value) and connects with the field distribution in the next Lo sub-segment. The amplitude for the cosine function (the absolute value) of the field distribution in the first Hi sub-segment is lower than in the first Lo sub-segment. The (Lo, Hi), (Lo, Hi) arrangement assure an oscillatory decrease of the field distribution toward the margins. After each pair Lo, Hi the amplitude of the field decreases proportional to the sqrt $(n_{Lo}^2 - n_1.real^2)$/sqrt $(n_{Hi}^2 - n_1.real^2)$ ratio.

There is still a decreasing oscillatory behavior if the two separate quarter wavelength conditions are relaxed to a half wavelength condition:

$$w_{Lo}/\Lambda_{Lo} + w_{Hi}/\Lambda_{Hi} = 1/2 \quad (6)$$

With this condition, smaller decreasing ratios from one pair to the other are obtained.

If the sequence of transparent (Lo, Hi) sub-segment pairs would continue enough, and the amplitude would go to zero, no other segment would be necessary. If they somewhere and somehow stop at the chip margin, reflections from the chip margins, reflections whose phase cannot be exactly controlled, can disturb the main segment operation. The reflecting-filters can be named also lateral Bragg reflectors.

The role of the margin segments 3 and 3' is to attenuate by absorption the field exiting from the last sub-segment of the reflecting-filter. The sign of the imaginary part of the effective refractive index is opposite to that of the imaginary part of the effective refractive index in the main segment. In absolute value, for the example given in Table 1, it is four times as great. To avoid the introduction of a new type of transversal structure, the margin segment could be of the same transversal structure as that in the main segment, only its active region is left unexcited. The width of the margin segments should be large enough to allow for a full practical decay. In this example was chosen equal to 22 μm (or greater).

There are possible higher order modes than the basic one. A discrimination mechanism should impede them to reach threshold and to oscillate.

Discrimination is quantified by the difference in modal gain. The modal gain depends on the confinement factor $\Gamma$, which describes the mode coupling with the electrical excitation, and on modal attenuation $\alpha$. The lateral confinement factor $\Gamma 0$ is equal to the integral of $|E|^2$ over the active segment divided by the integral of the same quantity over the whole y space. Consider the active segment gain as being G. The mode effective modal gain $G_m$ is given by:

$$G_m = G\Gamma - \alpha \quad (7)$$

The discrimination means that the basic mode has a modal gain advantage over other modes. The following relation gives this gain advantage:

$$\Delta G = (G_m)_{basic} - (G_m)_{any\ other} \quad (8)$$

Both the mode confinement factor and the modal losses act as discrimination mechanisms and their effect are summed in relation (8).

The higher order modes mentioned above have a lower confinement factor relative to the main segment. Due to the filtering action of the reflecting filters, these modes have a higher penetration in the margin segments and a higher attenuation. In this way, together with reflecting filter, the margin segments fulfill another role, namely the modal discrimination against non-preferred modes.

Figure 3:
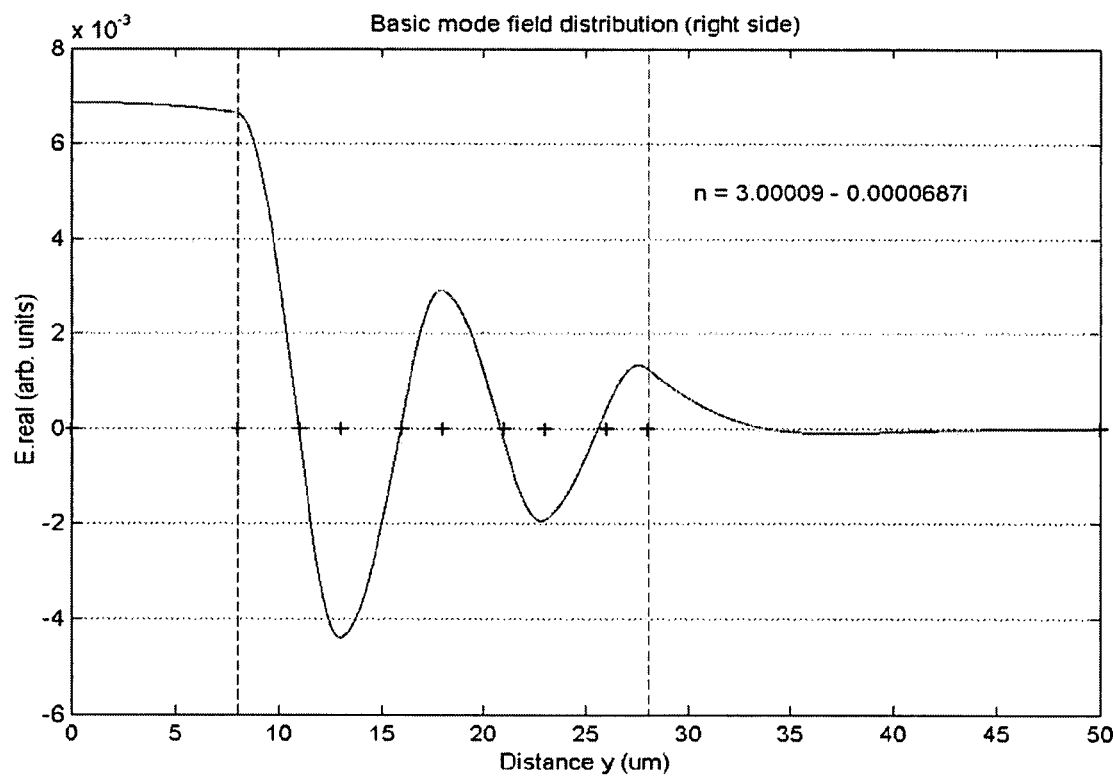
FIG. 3 is a graph of a basic mode field distribution for the structure with reflecting filters.

FIG. 3 shows the graph of the basic mode lateral field distribution for the structure described in Table 1. FIG. 3 and all further similar figures present only the right side of the field distribution from a symmetry axis. Since some of the effective refractive indexes were complex numbers, the field distribution is also a represented by complex numbers E=E.real+iE.imag. In each coordinate point these complex numbers are phasors. They have delays in respect to each other. FIG. 3 represents the real part of the field distribution E.real for a phase that makes the real part close to its maxi-

TABLE 1

Constructive parameters for a single element diode laser with lateral reflecting filters. ($\lambda = 1$ μm)

| Segment names | Segm. # | effective refractive indexes | $\Lambda$s (μm) | widths w (μm) | w/$\Lambda$ | repetition |
|---|---|---|---|---|---|---|
| main segment | 1 | $3.2 - i \times 0.5 \times 10^{-4}$ | | 16 | | |
| Lo sub-segment | 4, 4' | $3.20108 = \text{sqrt}(3.2^2 + 12^{-2})$ | 12 | 3 | 1/4 | 4 times in each reflecting filter |
| Hi sub-segment | 5, 5' | $3.20244 = \text{sqrt}(3.2^2 + 8^{-2})$ | 8 | 2 | 1/4 | 4 times in each reflecting filter |
| margin segment | 3, 3' | $3.2 + i \times 2.0 \times 10^{-4}$ | | >=22 | | |

In Table 1 the main segment and the margin segments are formed with the same epitaxial structure. It was assumed a gain of 6.28 cm$^{-1}$ in main segment and an attenuation four times as great in absolute value for the margin segments. The influence of the gain on the real part of the effective refractive index was neglected.

As it was described before, the devices according to the invention works well for the basic mode, for which they were designed. Obviously, due to protuberances in the effective refractive index at the reflecting filter, there are other modes, localized in these protuberances. They do not couple with the gain in the main segment.

mum at the element middle point and the imaginary part close to zero. A complete representation of E is given in FIG. 4 which represents the modulus of E, |E|, together with FIG. 5, which represents the phase:

$$\text{phase} = -a\ \tan(E.\text{imag}/E.\text{real}). \quad (9)$$

In the chosen convention for representing the gain for the wave propagating in the z direction, the minus sign in formula (9) was introduced to have smaller phase for phasors with greater delays.

Some of the next phasors distributions will be represented only by the real part of a field distribution that has the imaginary part in the coordinate origin close to zero (i.e. has zero phase in the middle of the elements) and they will be called simply the field distributions.

Figure 6:
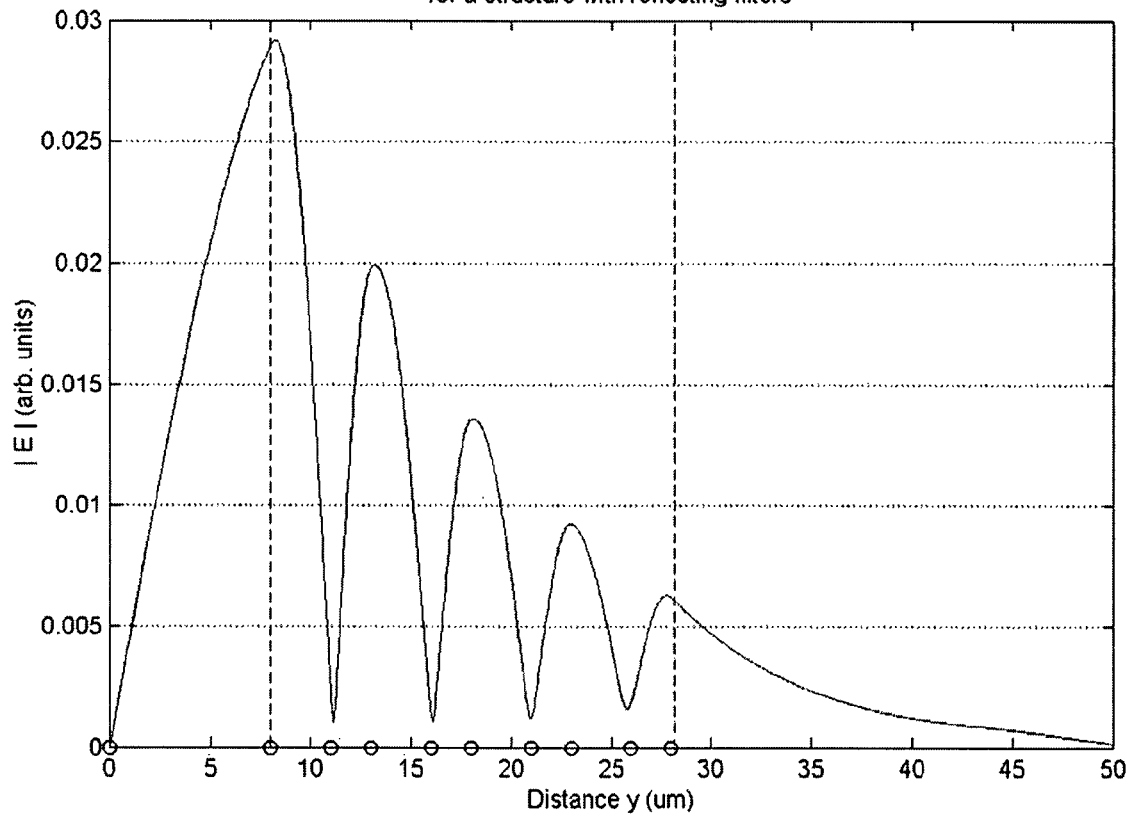
FIG. 6 is graph of a modulus of the next to basic mode field distribution for the structure with reflecting filters.

FIG. 6 shows a graph of the modulus of the field distribution of the mode next to the basic mode. Beside a higher penetration in the absorbing segment this next mode has also a lower confinement factor relative to the main segment. These both effects reduce its modal gain. The modal gain for the basic mode is 4.19 cm$^{-1}$ and for mode next order to it is 2.26 cm$^{-1}$. The relative difference from the basic mode gain is 46%, and it is sufficient for a very good modal discrimination.

The Second Example

Flat Field Distribution in a Single Element Structure with Adjusted Attenuators

Figure 7:
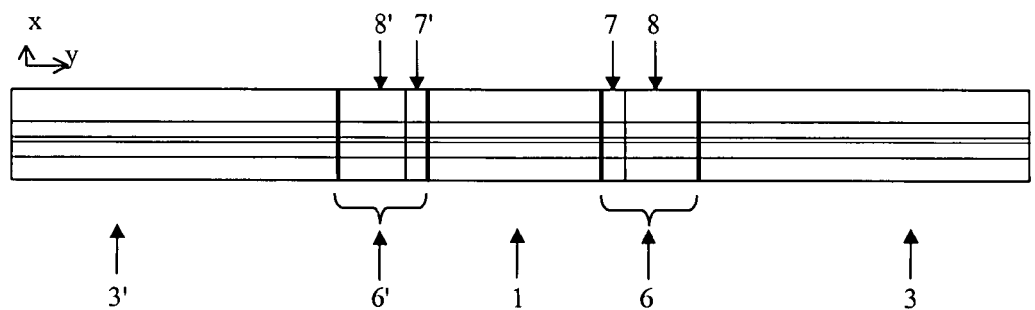
FIG. 7 is a layout of a segment structure for a diode laser with adjusted attenuators.
Figure 8:
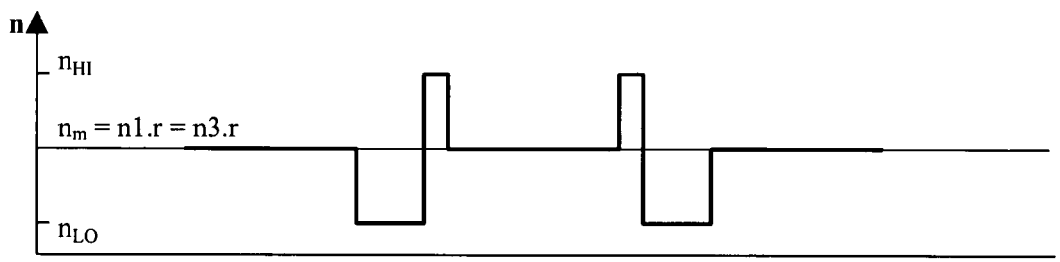
FIG. 8 is a graph of an effective refractive index profile for the structure with adjusted attenuators.

This example will demonstrate a similar way to bring a flat field distribution in the main segment of a single element diode laser, using an adjusted attenuator instead of a reflecting filter. A diode laser of this type is presented in FIG. 7. The effective refractive index profiles (real part) are shown in FIG. 8. The constructive parameters for this diode laser are given in Table 2. The constructive parameters are given for an emission wavelength λ=1 μm.

The diode laser comprises a main active segment 1, two systems of segments that form adjusted attenuators 6 and 6', adjacent to both sides of the main segment, and two margin segments 3 and 3', each externally adjacent to its corresponding adjusted attenuator. The segment systems for the adjusted attenuator comprise sub-segments (7, 8) and (7', 8').

The active segment has a complex effective refractive index $n_1$. $n_1 = n_1.\text{real} + n_1.\text{imag} \times i$. The imaginary part of $n_1$, $n_1.\text{imag}$, accounts for the gain in the main segment.

The segment system for an adjusted attenuator comprises two types of sub-segments: sub-segments 7 and 7', with an effective refractive index $n_{HI}$ and sub-segments 8 and 8', with an effective refractive index $n_{LO}$. These sub-segments are named HI and LO. Preferably the adjusted attenuators are transparent to reduce losses. In this case the effective refractive indexes are real numbers. $n_{HI}$ is higher than the real part of $n_1$. $n_{LO}$ is lower than the real part of $n_1$. The field distributions in sub-segments 7 and 7' are parts of cosine functions; the field distribution in sub-segments 8 and 8' are hyperbolic cosines. The cosine functions are characterized by a lateral wavelength $\Lambda_{HI} = \lambda/\text{sqrt}(n_{LO}^2 - n_1.\text{real}^2)$; the hyperbolic cosines are characterized by a characteristic length $\Lambda_{LO} = \lambda/\text{sqrt}(n_1.\text{real}^2 - n_{LO}^2)$.

The chosen values of $n_{HI}$ correspond to $\Lambda_{HI} = 8$ μm. The chosen value for $w_{HI}$, $W_{HI} = 1$ μm, corresponds to $\Lambda_{HI}8$.

The widths for the sub-segments 8 and 8', $w_{LO}$ are chosen at 4 μm. $\Lambda_{LO}$ will be chosen in such a way that the field distribution starts flat at a sub-segment 7 (7'), have a smooth transition at 7-8 and 7'-8' interfaces and ends flat at the end of 8 (8') sub-segments. This adjustment process is fulfilled by the condition:

$$(1/\Lambda_{HI})\tan(2\pi w_{HI}/\Lambda_{HI}) = (1/\Lambda_{LO})\tan h(2\pi w_{LO}/\Lambda_{LO}) \qquad (10)$$

$\Lambda_{LO}$ given by (10) is 7.97 μm and corresponds to $n_{LO} = 3.19754$.

It was stated that the preferred solution is flat in the main active segment 1. It will regain the fundamental mode name. It has no zero in the main segment and continually decays toward the margin segments.

The main active segment has a width, w1. A reasonable value for w1 is not restricted to the usual values for segments in single mode devices. It might be greater than in usual single mode devices since the lack of curvature avoids or delays the filament formation.

The condition (10) allows for multiple pairs (HI, LO) to be joined to each other. After each pair (HI, LO) of sub-segments the field distribution decrease with cos $(2\pi w_{HI}L_{HI})/\cos h(2\pi w_{LO}L_{LO})$ ratio, 0.06 in our example. This is a stepper decrease than in the first example and one (HI, LO) pair for each adjusted attenuator is enough.

The margin segments 3 and 3' have complex effective refractive indexes $n_3$. $n_3 = n_3.\text{real} + n_3.\text{imag} \times i$. The imaginary part of $n_3$, $n_3.\text{imag}$, accounts for the absorption in the margin segments. The role of the margin segments 3 and 3' is to attenuate by absorption the field exiting from the last sub-segment of the adjusted attenuator. The sign of the imaginary part of the effective refractive index is opposite to that of the imaginary part of the effective refractive index in the main segment. In absolute value, in the example given in Table 2, it is four times as great. The real part of the effective refractive index is close to the real part of the effective refractive index in the main segment. The margin segment could be of the same transversal structure as that in the main segment, only its active region is left unexcited. The width of the margin segments should be large enough to allow practically for a full decay. In this example was chosen equal to 37 μm (or greater).

TABLE 2

Constructive parameters for a first single element diode laser with lateral adjusted attenuators. (λ = 1 μm)

| Segment names | Seg. # | effective refractive indexes | Λs (μm) | widths w (μm) | w/Λ | repetition |
|---|---|---|---|---|---|---|
| main segment | 1 | 3.2 − i × 0.5 × 10$^{-4}$ | | 16 | | |
| HI sub-segment | 7, 7' | 3.2024 = sqrt(3.2$^2$ + 8$^{-2}$) | 8 | 1 | ⅛ | once for each adjusted attenuator |
| LO sub-segment | 8, 8' | 3.1975 = sqrt(3.2$^2$ − 7.97$^{-2}$) | 7.97 | 4 | 1/1.9925 | once for each adjusted attenuator |
| margin segment | 3, 3' | 3.2 + 0.0002 * i | | >=37 | | |

As mentioned, in Table 2 the main segment and the margin segments are formed with the same epitaxial structure. It was assumed a gain of 6.28 cm$^{-1}$ in main segment and an attenuation four times as great in absolute value for the margin segments. The influence of the gain on the real part of the effective refractive index was neglected.

Figure 9:
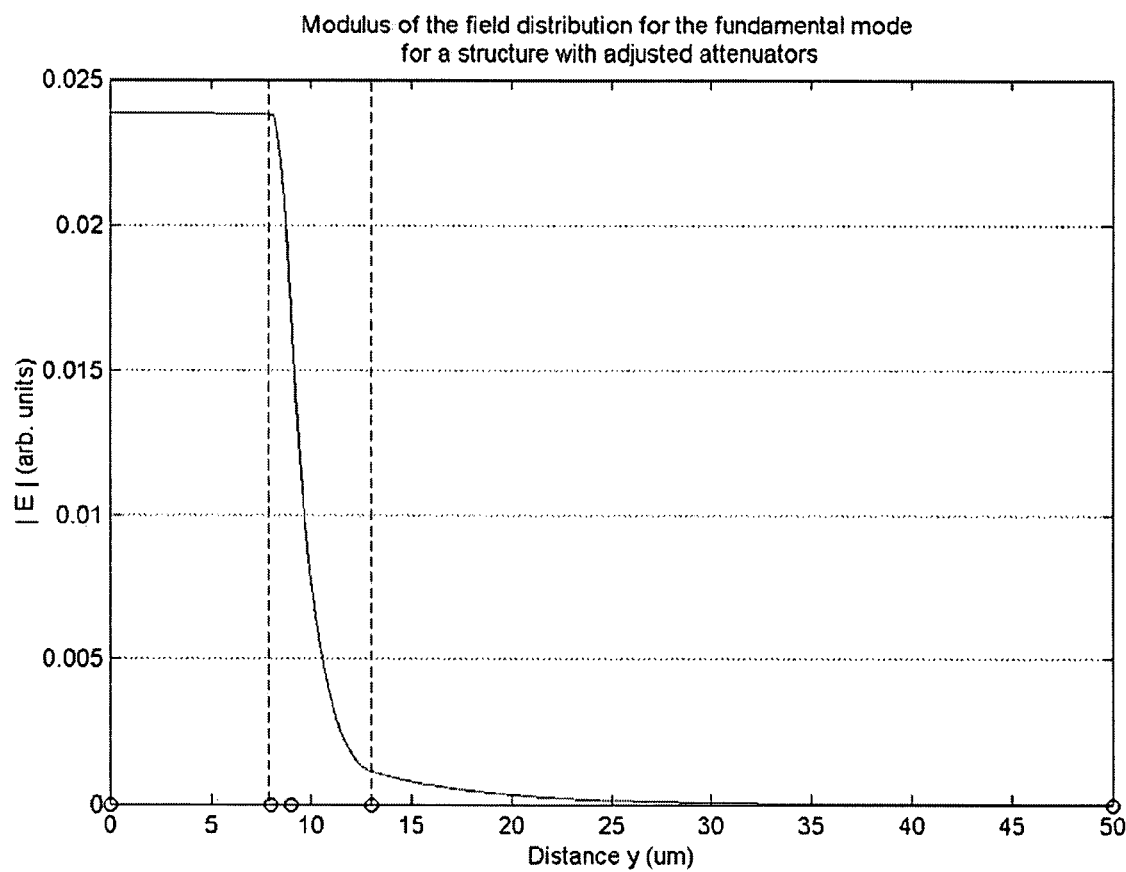
FIG. 9 is a graph of a modulus of the field distribution for the fundamental mode for the structure with adjusted attenuators.
Figure 10:
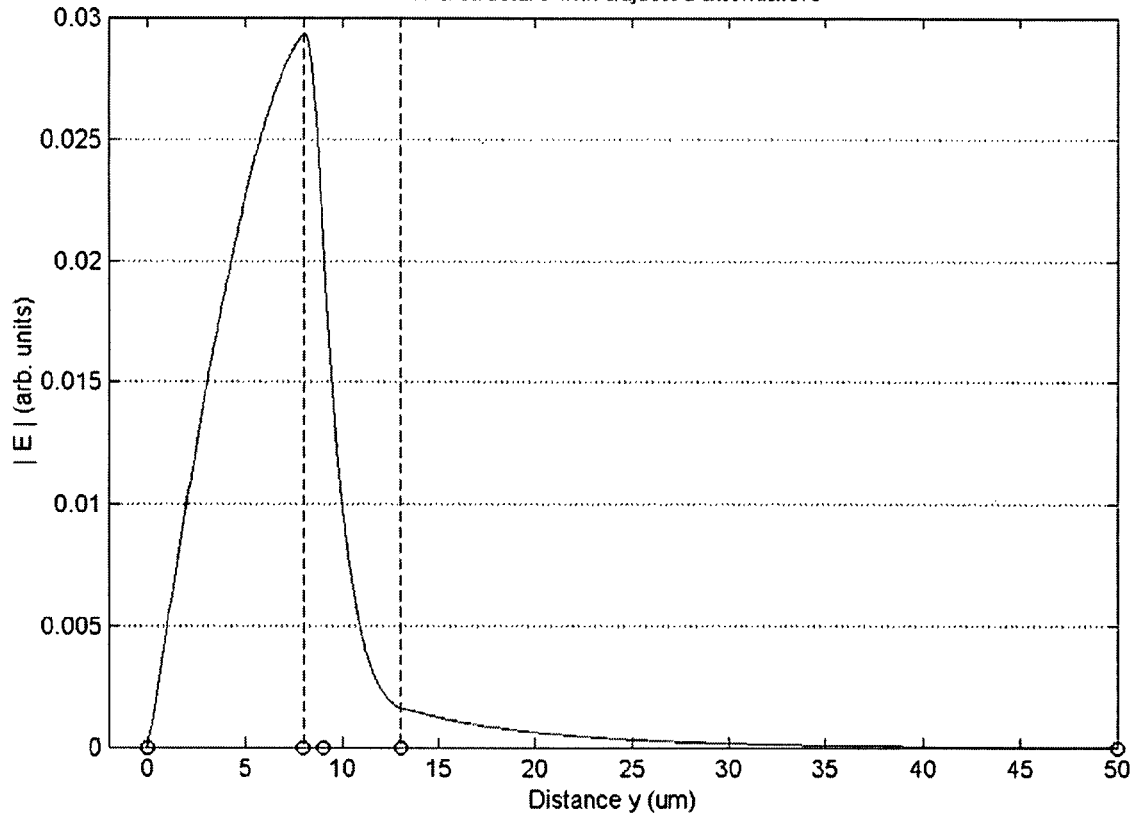
FIG. 10 is a graph of a modulus of the field distribution for the first order mode for the structure with adjusted attenuators.

FIG. 9 shows a graph of the modulus of the field distribution for the fundamental mode of the structure described in Table 2. FIG. 10 shows a graph of the modulus of the field distribution for the first order mode. The first mode has a low confinement factor relative to the main segment. This reduces its modal gain. The modal gain for the fundamental mode is 5.48 cm$^{-1}$ and for first order mode is 4.65 cm$^{-1}$. The relative difference is 18% from the fundamental mode gain, sufficient for a good modal discrimination.

The Third Example

Figure 11:
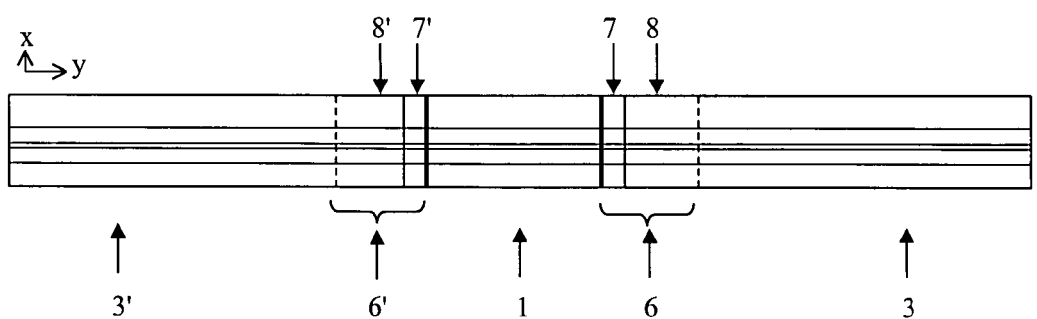
FIG. 11 is a layout of a segment structure for a diode laser with a second type of adjusted attenuators.
Figure 12:
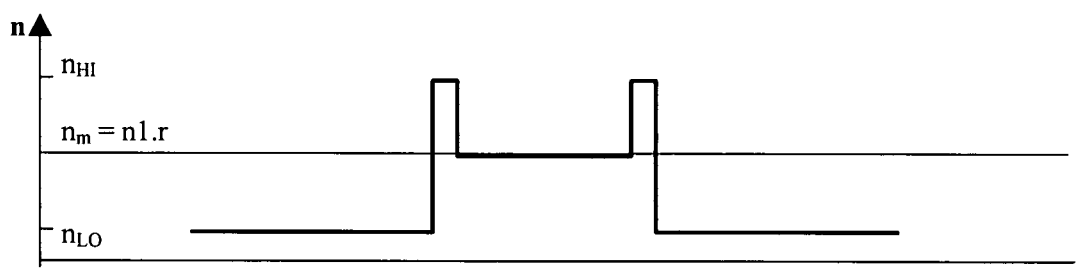
FIG. 12 is a graph of an effective refractive index profile for the structure with a second type of adjusted attenuators.

Flat Field Distribution in a Single Element Structure with a Second Type of Adjusted Attenuators This example will demonstrate a second way to bring a flat field distribution in the main segment of a single element diode laser, using also an adjusted attenuator instead of a reflecting filter. The margin segments attenuate the field by evanescent decay. This diode laser is presented in FIG. 11. The real part of the effective refractive index profile is shown in FIG. 12. The constructive parameters for this diode laser are given in Table 3. The constructive parameters are given for an emission wavelength λ=1 µm.

This example is in many respects similar to the second example. The main difference is that the margin segments are of the same type of transversal structure as the LO sub-segments of the adjusted attenuator and, in fact, they are included in the extended segment 8 (and 8'). In this way, the introduction of a new type of transversal segment structure is avoided. The sub-segments 8 and 8' are extended enough to induce a good attenuation, i.e. they are of the order of magnitude of a few $\Lambda_{LO}$.

To repeat, the chosen values of $n_{HI}$ correspond to $\Lambda_{HI}$=8 µm. The chosen value for $w_{HI}$, $w_{HI}$=1 µm, corresponds to $\Lambda_{HI}/8$.

$\Lambda_{LO}$ given by (10) is 7.97 µm and corresponds to $n_{Lo}$=3.19754.

TABLE 3

Constructive parameters for a second single element diode laser with lateral adjusted attenuators. (λ = 1 µm)

| Segment names | Seg. # | effective refractive indexes | Λs (µm) | widths w (µm) | w/Λ | repetition |
|---|---|---|---|---|---|---|
| main segment | 1 | 3.2 − i × 0.5 × 10$^{-4}$ | | 16 | | |
| HI sub-segment | 7, 7' | 3.2024 = sqrt(3.2$^2$ + 8$^{-2}$) | 8 | 1 | 1/8 | once for each adjusted attenuator |
| extended LO sub-segment | 8, 8' | 3.1975 = sqrt(3.2$^2$ − 7.97$^{-2}$) | 7.97 | a few $\Lambda_{LO}$ | 2-3 | once for each adjusted attenuator |
| margin | 3, 3' | same as LO sub-segment | | included in extended LO sub-segment | | |

It was assumed a gain of 6.28 cm$^{-1}$ in main segment. The influence of the gain on the real part of the effective refractive index was neglected.

Figure 13:
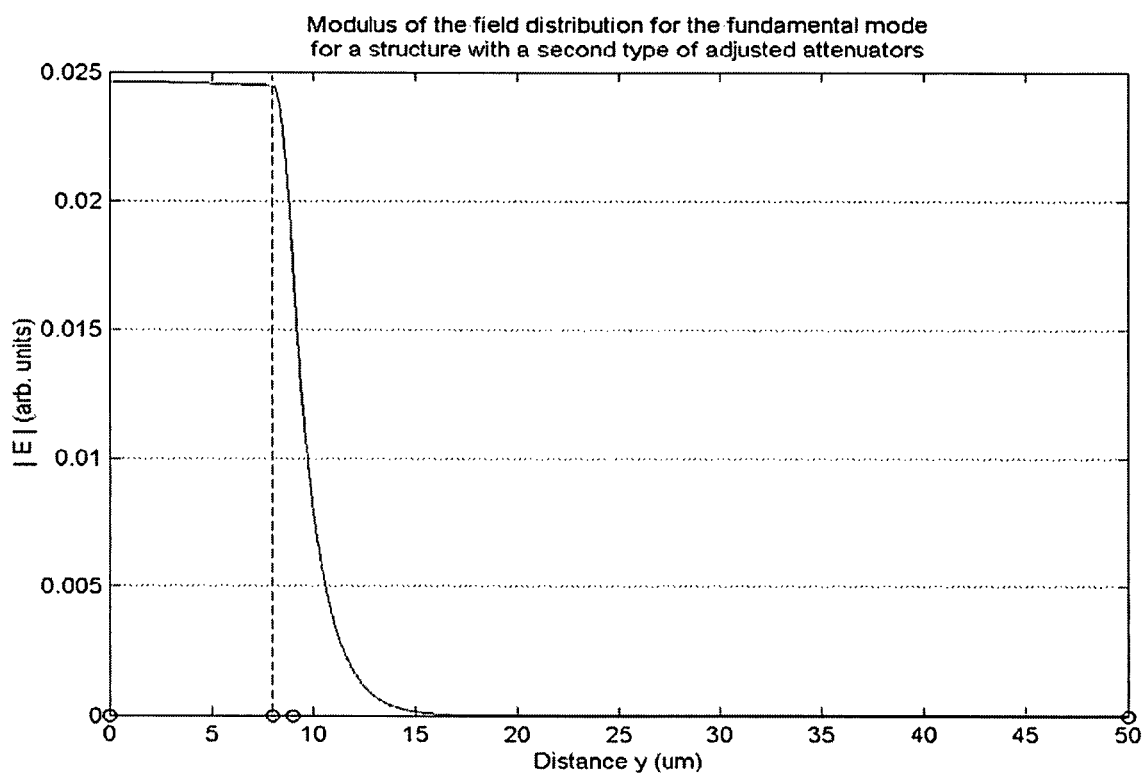
FIG. 13 is a graph of a modulus of the field distribution for the fundamental mode for the structure with the second type of adjusted attenuators.
Figure 14:
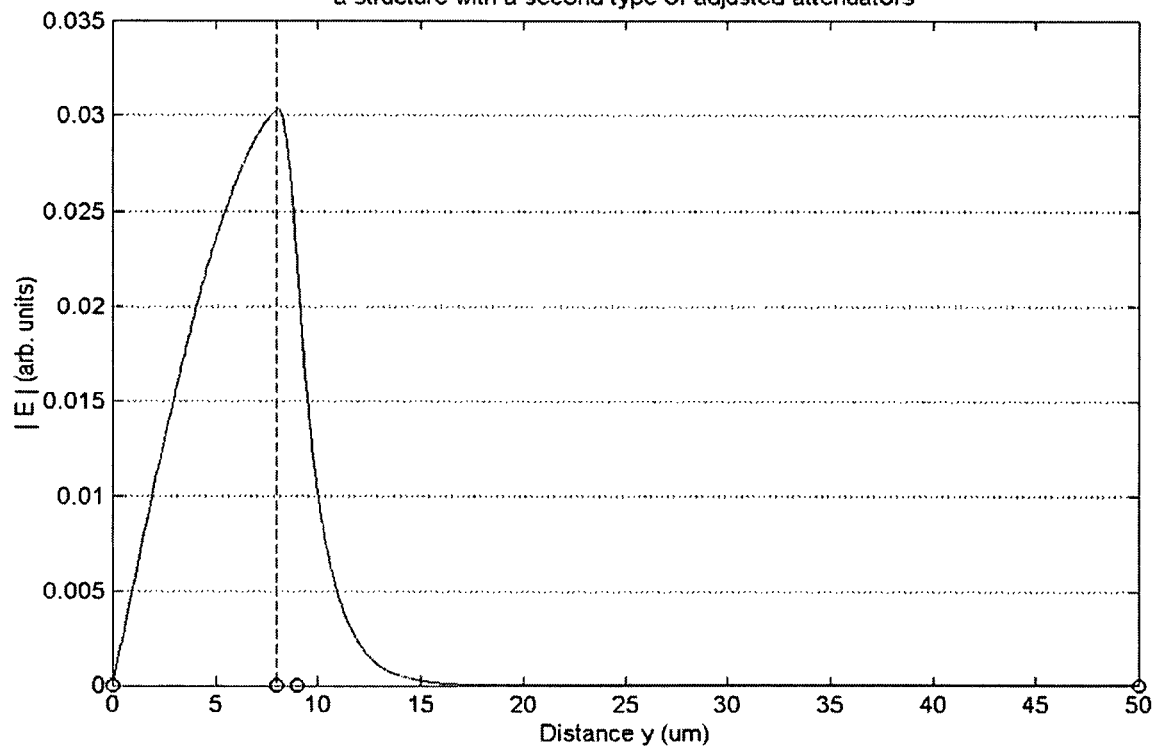
FIG. 14 is a graph of a modulus of the field distribution for the first order mode for the structure with the second type of adjusted attenuators.

FIG. 13 shows a graph of the he modulus of the field distribution for the fundamental mode for the structure described in Table 3. FIG. 14 shows modulus of the field distribution for the first order mode. The modal gain for the fundamental mode is 5.50 cm$^{-1}$ and for first order mode is 4.73 cm$^{-1}$. The difference is 16% from the fundamental mode gain, sufficient for a good modal discrimination.

The third example is in many respects very similar to the second example. The shape of the fundamental mode is very similar to that presented in the second example. The discrimination against the first order mode is similar. Both examples make use of only three types of transversal structures. As it will be seen further, he second type of adjusted attenuators works better for the array case.

The Fourth Example

Figure 4:
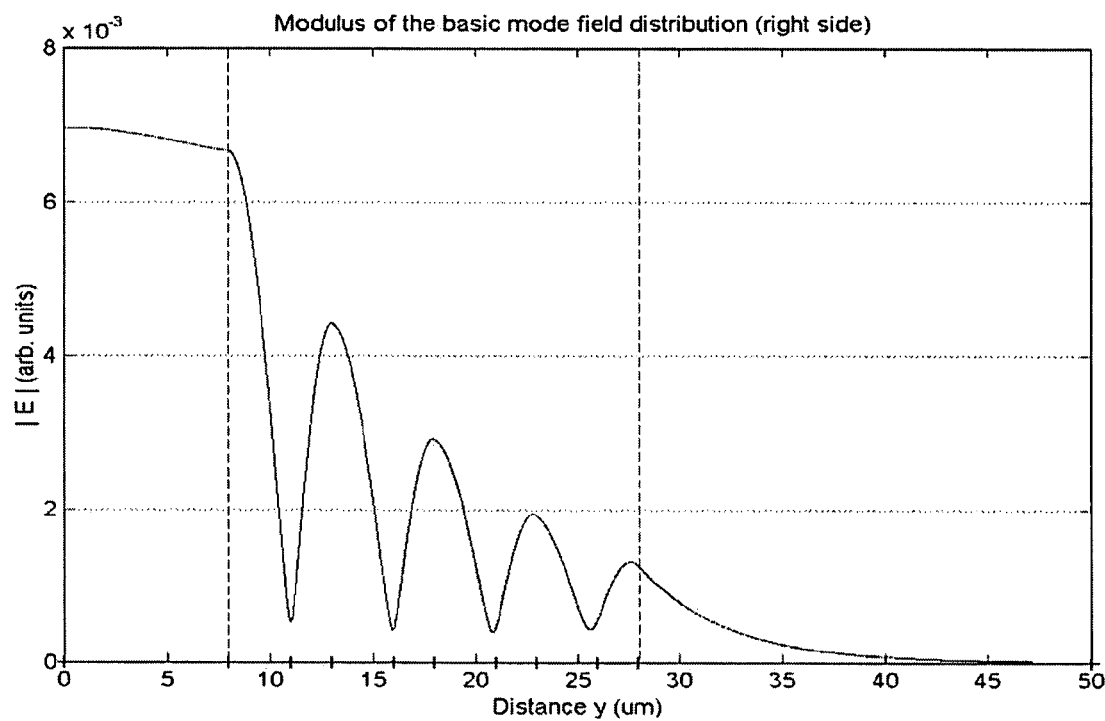
FIG. 4 is a graph of a modulus of the basic mode field distribution for the structure with reflecting filters.
Figure 5:
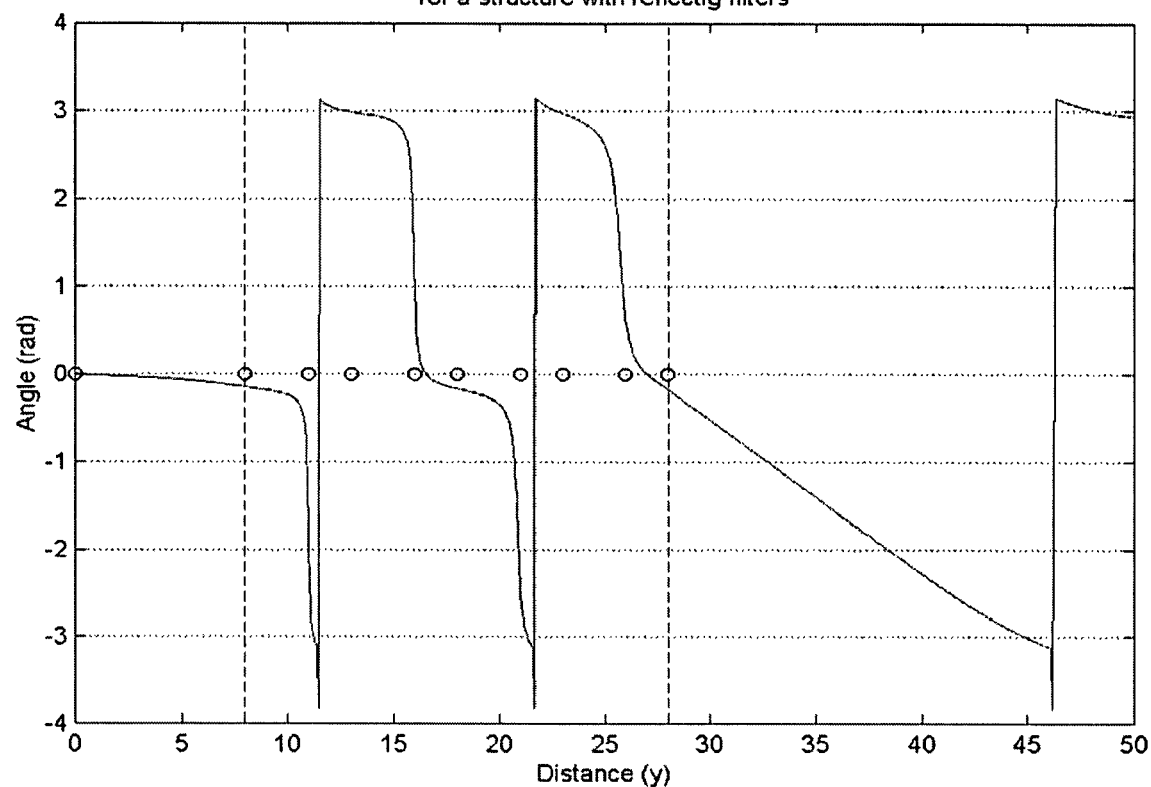
FIG. 5 is graph of a phase of the basic mode field distribution for the structure with reflecting filters.
Figure 15:
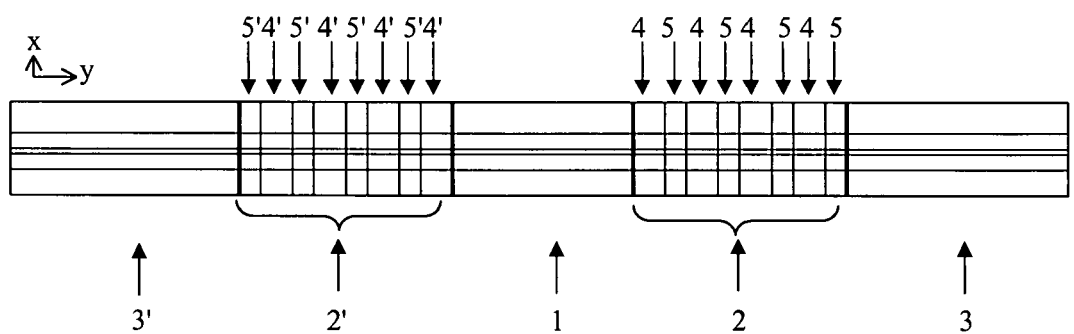
FIG. 15 is a layout of a segment structure of a diode laser with reflecting-filters and with depressed effective refractive index in the main segment.
Figure 16:
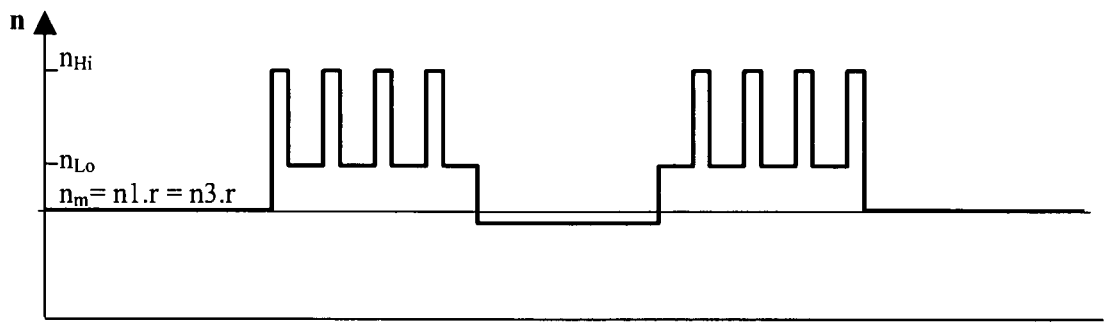
FIG. 16 is a graph of an effective refractive index profile for the structure with reflecting filters and with depressed effective refractive index in the main segment.

A Single Element Structure with Depressed Effective Refractive Index and with Simulated Thermal Effect in the Main Segment One may notice in FIG. 3 and FIG. 4 that the field distribution in the main segment is slightly convex. If it would not be the imaginary part in the effective refractive indexes for the main segment, the field distribution would be flatter. A depression can be introduced by design, to induce a concave field distribution in the main segment. The new design parameters are given in Table 4. (Partially, such a depression of the real part of the effective refractive index is induced by the gain.) This diode laser is presented in FIG. 15. The real part of the effective refractive index profile is shown in FIG. 16.

TABLE 4

Constructive parameters for a single element diode laser with lateral reflecting filters and depressed effective refractive index in the main region. (λ = 1 µm)

| Segments | effective refractive indexes | Λs (µm) | widths w (µm) | repetition |
|---|---|---|---|---|
| main segment | 3.1999 − i × 0.5 × 10$^{-4}$ | | 16 | |
| Lo sub-segment | 3.20108 = sqrt(3.2$^2$ + 12$^{-2}$) | 12 | 3 | 4 times in each reflecting filter |

TABLE 4-continued

Constructive parameters for a single element diode laser with lateral reflecting filters and depressed effective refractive index in the main region. (λ = 1 µm)

| Segments | effective refractive indexes | Λs (µm) | widths w (µm) | repetition |
|---|---|---|---|---|
| Hi sub-segment | 3.20244 = sqrt(3.2$^2$ + 8$^{-2}$) | 8 | 2 | 4 times in each reflecting filter |
| margin segment | 3.2 + i × 2.0 × 10$^{-4}$ | | >=22 | |

Figure 17:
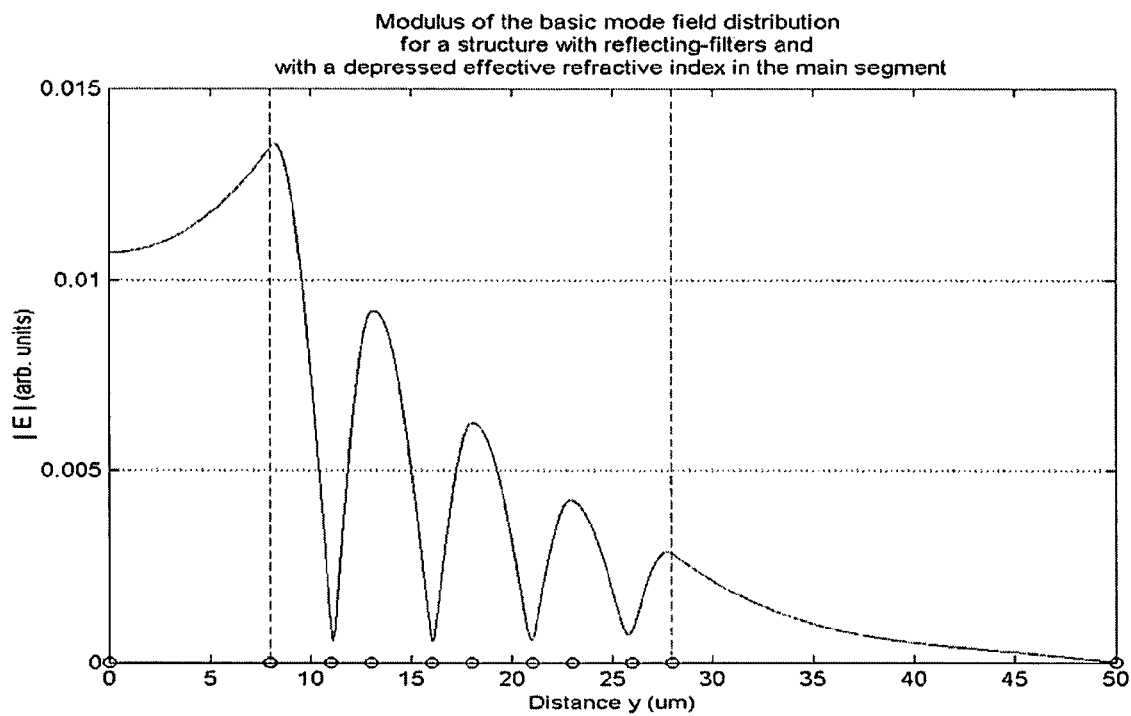
FIG. 17 is a graph of a modulus of the basic mode field distribution for the structure with reflecting filters and with depressed effective refractive index in the main segment.

The basic mode for this structure is presented in FIG. 17. In the main segment the field distribution in now concave. This example shows that, if slight alterations are made in the main segment for the effective refractive indexes, relative to designed value used as a reference for all other effective refractive indexes, the shape of the field distribution can change from convex to concave. These alterations can be used as a design tool to fight thermal filamentation. Thermal filamentation changes the curvature for the field distribution toward more convex shapes. Starting from a concave shape, the thermal effect will flatten them out.

Figure 18:
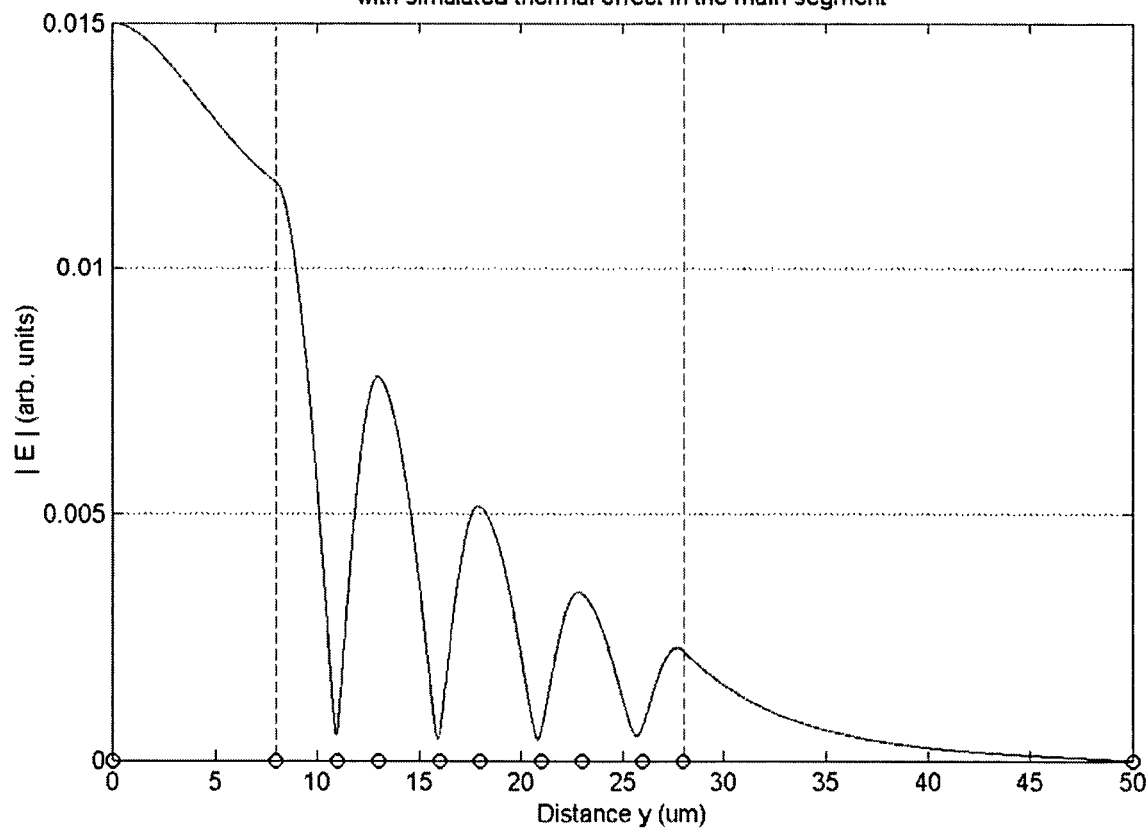
FIG. 18 is a graph of a modulus of the basic mode field distribution for the structure with reflecting filters and with simulated thermal effect in the main segment.

Table 5 presents a structure with simulated thermal filamentation without a depressed effective index in the main segment. The real part of the effective refractive index decreases in the main segment parabolically from the center value of 3.2001 to the margin value of 3.2. FIG. 18 shows the modulus of the basic mode field distribution. One may notice the field distribution has a pronounced maximum in the center of the main segment.

TABLE 5

Constructive parameters for a single element diode laser with lateral reflecting filters and simulated thermal effect in the main segment. ($\lambda = 1$ μm)

| Segments | effective refractive indexes | $\Lambda$s (μm) | widths w (μm) | repetition |
|---|---|---|---|---|
| main segment | $3.2 + 0.0001 * (8 - y) * (8 - y)/64 - i \times 1.0 \times 10^{-4}$ | | 16 | |
| Lo sub-segment | $3.20108 = \text{sqrt}(3.2^2 + 12^{-2})$ | 12 | 3 | 4 times in each reflecting filter |
| Hi sub-segment | $3.20244 = \text{sqrt}(3.2^2 + 8^{-2})$ | 8 | 2 | 4 times in each reflecting filter |
| margin segment | $3.2 + i \times 4.0 \times 10^{-4}$ | | >=22 | |

Figure 19:
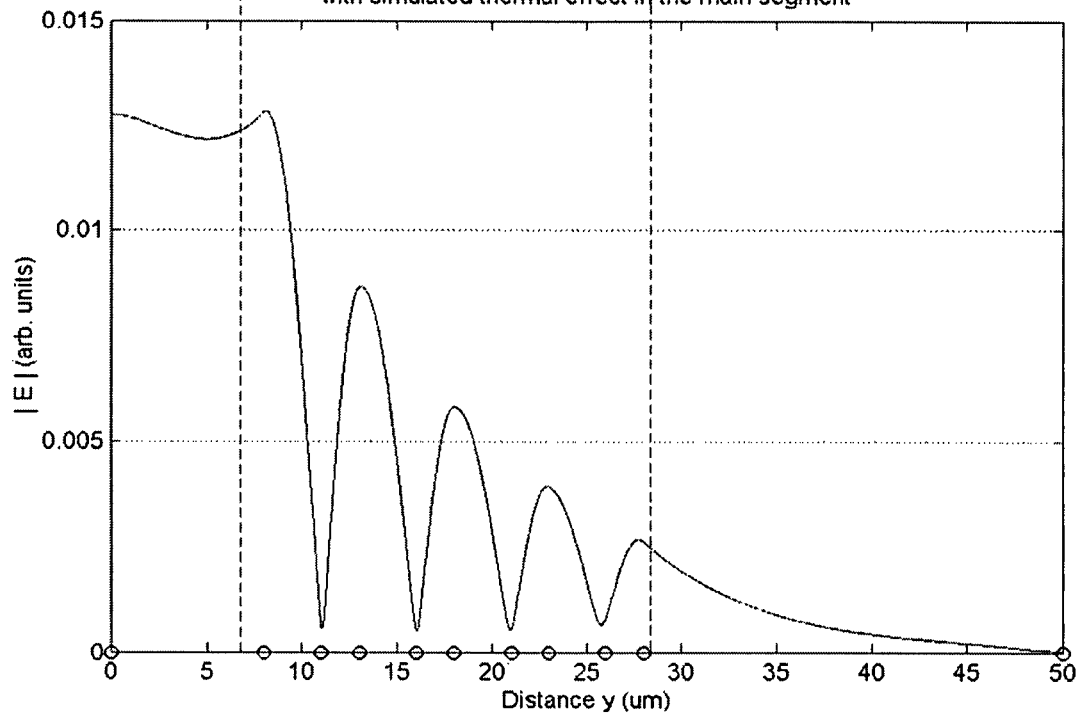
FIG. 19 is a graph of a modulus of the basic mode field distribution for the structure with reflecting filters, with depressed effective refractive index and with simulated thermal effect in the main segment.

Table 6 presents a structure with simulated thermal filamentation and with a depressed effective index in the main segment. FIG. 19 shows a graph of the modulus of the basic mode field distribution. One may notice the field has returned to a flatter shape.

TABLE 6

Constructive parameters for a single element diode laser with lateral reflecting filters and simulated thermal effect and a depressed effective refractive index in the main region. ($\lambda = 1$ μm)

| Segments | effective refractive indexes | $\Lambda$s (μm) | widths w (μm) | repetition |
|---|---|---|---|---|
| main segment | $3.1999 + 0.0001 * (8 - y) * (8 - y)/64 - i \times 0.5 \times 10^{-4}$ | | 16 | |
| Lo sub-segment | $3.20108 = \text{sqrt}(3.2^2 + 12^{-2})$ | 12 | 3 | 4 times in each reflecting filter |
| Hi sub-segment | $3.20244 = \text{sqrt}(3.2^2 + 8^{-2})$ | 8 | 2 | 4 times in each reflecting filter |
| margin segment | $3.2 + i \times 2.0 \times 10^{-4}$ | | >=22 | |

The Fifth Example

Flat Field Distributions in Each Element and Almost Equal Amplitudes from One Element to the Other in an Array Structure with Ten Elements with Reflecting-Filters and with in Phase Coupling Inter-Elements This example discusses an array that has 10-coupled elements with constructive parts of the type given in the first single element example.

Figure 20:
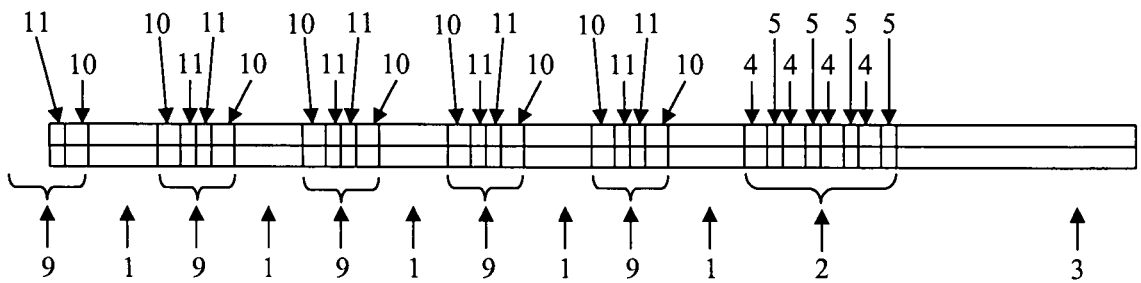
FIG. 20 is a layout of a segment structure for a ten elements array with reflecting-filters and with in-phase coupling inter-elements.
Figure 21:
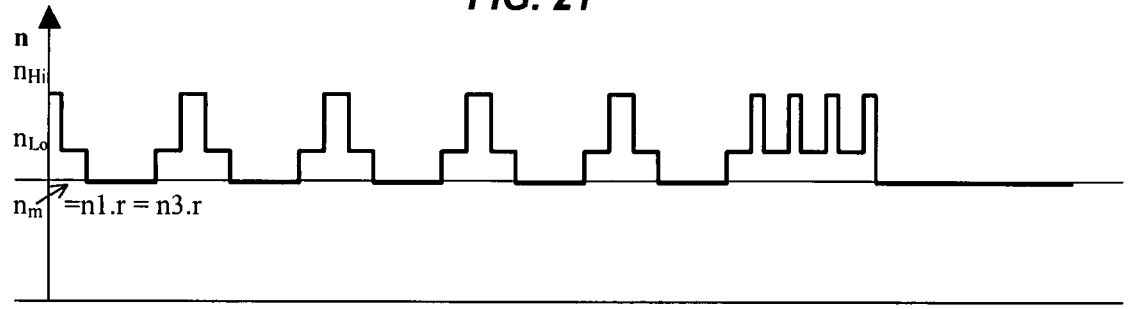
FIG. 21 is a graph of an effective refractive index profile for the ten elements array structure with reflecting-filters and with in-phase coupling inter-elements.

This array is presented in FIG. 20. FIG. 20 shows only the right side of the array, i.e, 5 elements only. The depicted structure starts at the origin with the middle point of the fifth inter-element segment. The real part of the effective refractive index profile is shown in FIG. 21. The constructive parameters for this array are shown in Table 7. The constructive parameters are given for an emission wavelength $\lambda$=1 μm. A very efficient adjustments to the structure presented in FIGS. 20 and 21 should be mentioned. This adjustment is described in Table 8.

The array comprises active elements 1, inter-elements 9 situated between each pair of elements, two reflecting-filters 2 and 2', adjacent to end active elements, and two margin segments 3 and 3', each externally adjacent to its corresponding reflecting filter. As before, the segment systems for the reflecting filters comprise sub-segments 4, 5, 4' and 5'. The inter-elements comprise systems of sub-segments 10 and 11. These sub-segments can be of the type 4 and 5 (and 4' and 5'), i.e. the Lo, Hi sub-segments (10, respectively 11) in the inter-elements have the same transversal structure as the Lo, Hi sub-segments in the reflective-filters (4, respectively 5). In this case the number of the types of transversal structures is maintained to a minimum.

The active elements have an intrinsic gain of 6.28 cm$^{-1}$, reflected in the imaginary part of its effective refractive index.

The inter-element couples in-phase the flat field distribution in elements. In the inter-element system of sub-segments the field distribution has a symmetric shape relative to the middle of each inter-element and smoothly connects to the preferred flat field distribution in elements. A simple and efficient way to obtain such a field distribution is to use a (Lo, Hi)(Hi, Lo) symmetric sequence. In this sequence each sub-segment is a quarter lateral wavelength:

$$w_{Lo}=\Lambda_{Lo}/4=\lambda/(4\text{sqrt}((n_{Lo}^2-n_1.\text{real}^2))$$

$$w_{Hi}=\Lambda_{Hi}/4=1/(4\text{sqrt}\,(n_{Hi}^2-n_1.\text{real}^2)) \quad (11)$$

Into a relaxed condition the (Lo, Hi)(Hi, Lo) sequences represent a full equivalent wavelength:

$$w_{Lo}/\Lambda_{Lo} + 2w_{Hi}/\Lambda_{Hi} + w_{Lo}/\Lambda_{Lo} = 1 \quad (12)$$

Other similar symmetric sequences can have an integer number of equivalent half wavelength on each side of the symmetric structure and the reduced width for the full inter-element is an integer. For example the next structure is (Lo, Hi)(Lo, Hi)(Hi, Lo)(Hi, Lo) where each (Lo, Hi) pair represents a half wavelength. Such sequences enhance the selection of the basic super-mode in array. The inter-elements bring a supplementary discrimination for other super-modes, beside the reflecting filters. They might be viewed as distributed filters.

The lateral structure ends with a (Lo, Hi)(Lo, Hi)(Lo, Hi)(Lo, Hi) reflective-filter and with an absorbing margin. As in the case of a single element structure, the reflective filter reduces the lateral field distribution before it reaches the absorbing margin segment.

In this example, the width of the margin segments was chosen to 50 μm (or greater). In absolute value, the imaginary part of the effective refractive index was chosen 4 times greater than the imaginary part of the effective refractive in the element segments. The real part of the effective refractive index was chosen equal to the real part of the effective refractive in the element segments.

TABLE 7

Constructive parameters for a 10 elements array with lateral reflecting filters and in-phase coupling inter-elements. ($\lambda$ = 1 μm)

| Segments | effective refractive indexes | $\Lambda$s (μm) | widths w (μm) | w/$\Lambda$ | repetition |
|---|---|---|---|---|---|
| elements | $3.2 - i \times 0.5 \times 10^{-4}$ | | 10 | | 10 times |
| inter-elements (formed of Lo and Hi sub-segments) | | | 3 + 2 + 2 + 3 | | 9 times |
| Lo inter-element sub-segment | $3.20108 = \sqrt{3.2^2 + 12^{-2}}$ | 12 | 3 | ¼ | 2 times in each inter-element |
| Hi inter-element sub-segment | $3.20244 = \sqrt{3.2^2 + 8^{-2}}$ | 8 | 2 | ¼ | 2 times in each inter-element |
| Reflecting filter (formed of Lo and Hi sub-segments) | | | | | |
| Lo reflecting-filter sub-segment | $3.20108 = \sqrt{3.2^2 + 12^{-2}}$ | 12 | 3 | ¼ | 4 times in each reflecting filter |
| Hi reflecting filter sub-segment | $3.20244 = \sqrt{3.2^2 + 8^{-2}}$ | 8 | 2 | ¼ | 4 times in each reflecting filter |
| margin segment | $3.2 + i \times 2.0 \times 10^{-4}$ | | >=50 | | |

Figure 22:
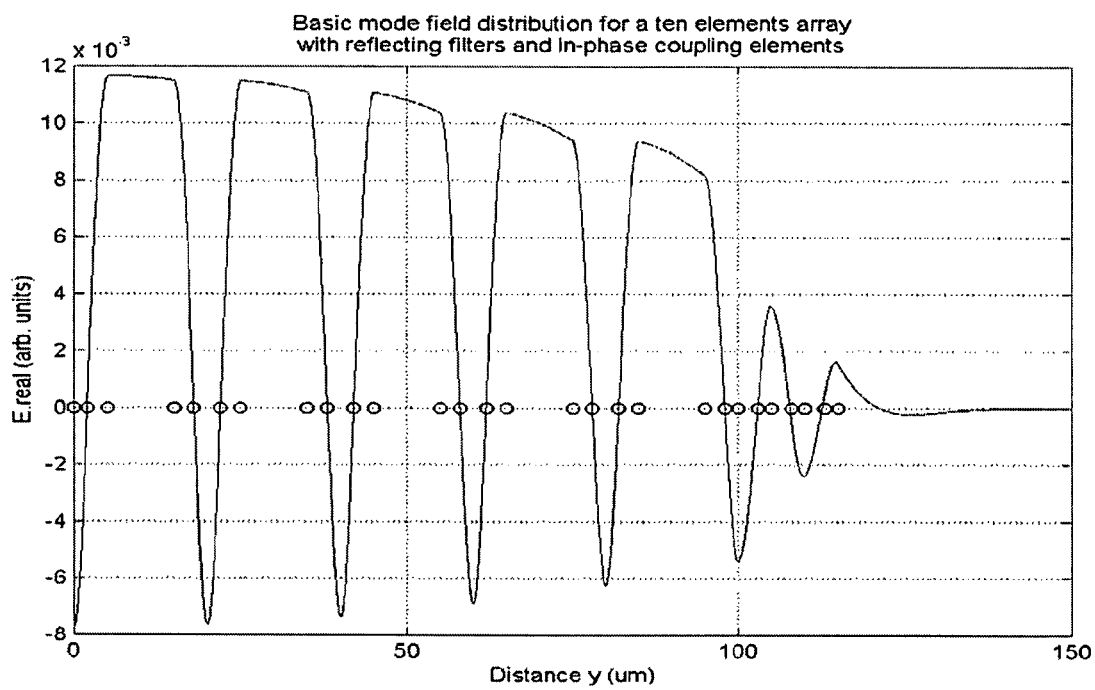
FIG. 22 is a graph of a basic mode field distribution for the ten elements array with reflecting-filters and with in-phase coupling inter-elements.

FIG. 22 depicts the preferred super-mode. It has a modal gain of 4.43 cm$^{-1}$. It will be named the basic super-mode. An index may be used to characterize the super-mode family. The basic super-mode index among the other super-modes is 19 since it has 19 zeros in the main extent of the array. Its field distribution is $E_{20}$. This super-mode has two distinctive features: it has flat field distributions in each element and has almost equal amplitudes from one element to the other. Such features will enhance the coupling with the electric excitation, which has a similar distribution, and will reduce threshold and improve slope efficiency.

The depicted element segments have the same width and the whole structure is periodic up to the reflecting filter. The effective refractive index for the basic super-mode is equal to the element effective refractive index thus allowing for unequal element widths. This fact is of significance for two design refinements:

to make wider element at array ends and in this way to use the three zone furnace principle for uniform temperature distribution to discriminate for the out of phase mode (OP) that has also a high confinement factor, i.e. couples well with the electric excitation distribution.

As for the case of single element laser, the absorbing margin is desirable to give an end to the field distribution. Without it, uncontrolled reflections from the chip margins will disturb the operation in the basic super-mode. Since the inter-element segments are preferably non-absorbing, the absorbing margins help prevent lateral laser oscillations (i.e. cross lasing).

The basic super-mode has its effective refractive index almost equal to the element effective refractive index. Beside the basic super-mode there are adjacent modes, with the effective refractive index higher or lower than its own effective refractive index.

The adjacent super-modes with the real part of the effective refractive index higher than the basic mode real part of the effective refractive index are in fact localized modes, trapped in the refractive index protuberances of inter-elements. They do not couple well with the element active region and do not compete with the basic super-mode.

The adjacent super-modes with the real part of the effective refractive index lower than the basic mode real part of the effective refractive index are leaky modes. The first few adjacent leaky super-modes compete with the basic super-mode and they may start oscillating somewhere above the threshold.

There are three recognized mechanisms for discrimination against other than the basic super-mode in arrays:
coupling with the gain provided in element segments
losses outside the main array
inter-element losses As provided by the current injection in elements, the gain profile is flat in these segments and equal in magnitude from one element to the other. The flat field distribution of the basic super-mode assures the maximum confinement factor for this mode.

Any new zero in modal field distribution, as with adjacent leaky modes, will break this ideal superposition between gain and field and will decrease the confinement factor.

The absorbing margins are an essential design feature of this type of arrays. They end the field distribution outside the reflecting filter. The field arriving at the absorbing margins dampens laterally with a damping constant K that depend on the attenuation coefficient for the propagation in the z direction. For the example in Table 7 the imaginary part of the effective refractive index in margin segments is 4 times greater in absolute value than the imaginary part of the effective refractive index in the element segments. In the absorbing margin a region of average extent 1/K induces losses for the entire super-mode. The losses greatly depend on the field magnitude at the reflecting filter-absorbing margin interface.

The reflecting filter has the role of decreasing the field magnitude outward. It best fulfils this role for the basic mode, for which the reflecting filter was tuned. As the effective refractive index of adjacent leaky modes is not tuned to the filter, these modes are better transmitted laterally through the filter and the magnitude of the field at the reflecting filter-absorbing margin interfaces is higher. Consequently they have higher modal losses.

Unfortunately, there is the out of phase (OP) mode that couples well with the gain elements and is not transmitted by the reflecting filter. An additional design feature should be used to discriminate against this mode.

The third mechanism, the inter-element absorption is not effective in this type of array since it was proposed that the inter-element to be transparent.

Figure 23:
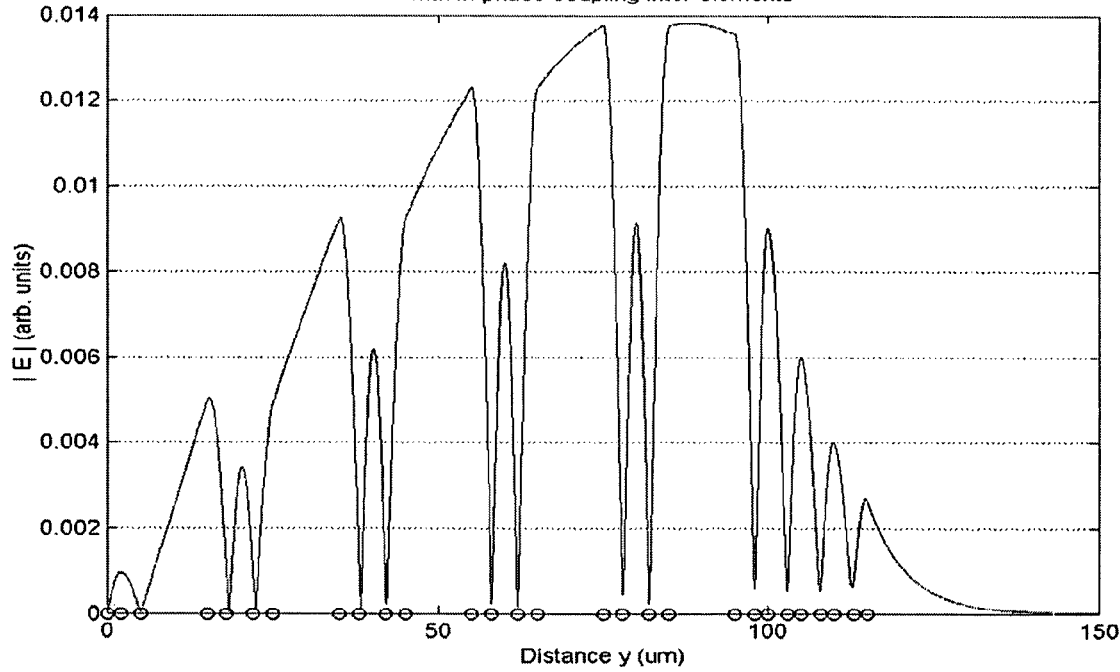
FIG. 23 is a graph of a modulus of the field distribution for the adjacent mode of the ten elements array with reflecting-filters and with in-phase coupling inter-elements.

FIG. 23 presents the adjacent super-mode 20 (I remind that the basic mode is mode 19) for the structure given in Table 5. This mode has a slightly lower modal gain due to a lower confinement factor and an increased penetration in the absorbing margin. The relative gain advantage is nevertheless very low, only 2.7%. Can such a small advantage handle the difficult problem of mode discrimination during operation? An extra argument exists. It is known that for usual incumbent diode lasers, as the extracted power increases, the gain ceases to be flat, being lower in places where the field intensity is higher. The gain profile that develops favors other modes (or super-modes) than modes that were first to reach threshold. The gain advantage is lost. When the field distribution is flat in each element and with equal amplitude from one element to another during operation, the gain, even after threshold, will remain flat in each element and with equal amplitude from one element to the other. It will continue to couple best with the basic super-mode and the small discrimination advantage remains in place.

Figure 24:
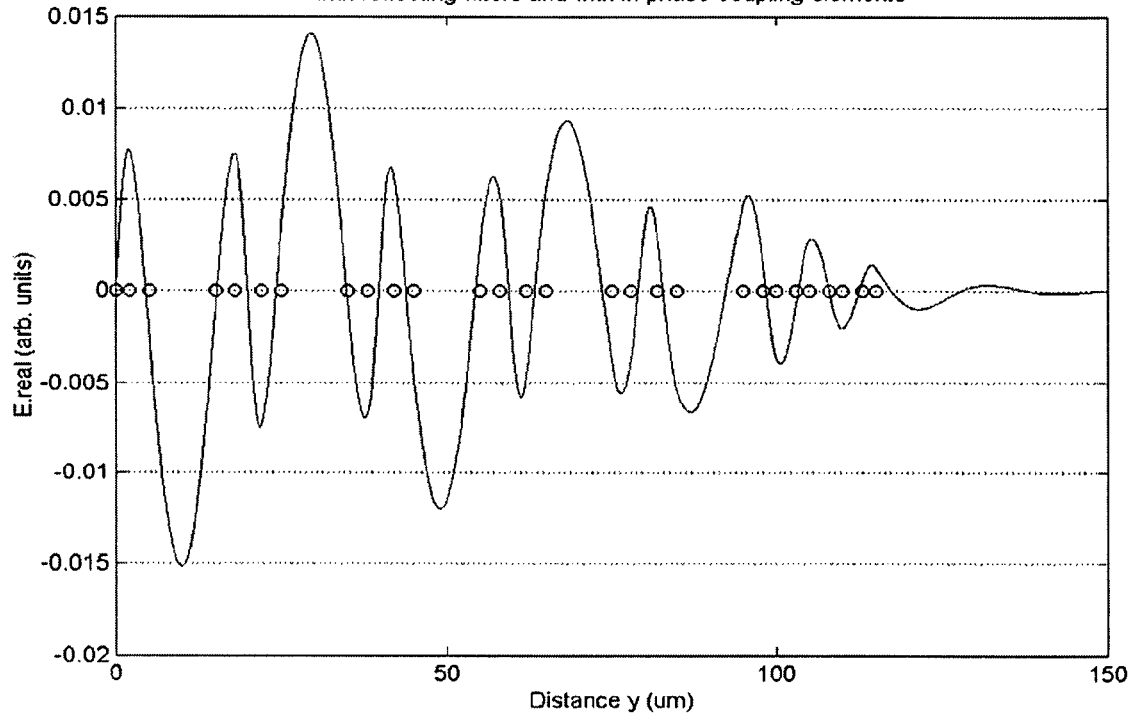
FIG. 24 is a graph of a field distribution for the out of phase (OP) mode of the ten elements array with reflecting-filters and with in-phase coupling inter-elements.

FIG. 24 presents the out of phase (OP) mode. Due to its very low penetration in the absorbing region 3 and 3' this mode has a gain advantage relative to the basic mode. An adjustment process is needed. This adjustment process is described in table 8.

TABLE 8

Adjustment needed to discriminate against OP mode

| Segment to be adjusted | Adjustment | Influence of the adjustment |
|---|---|---|
| One or more elements, preferably lateral margin elements | Unequal element widths. The lateral end element widths increased from 10 μm to 15 μm | Disturb element periodicity, Increase the losses for the OP mode |

Figure 25:
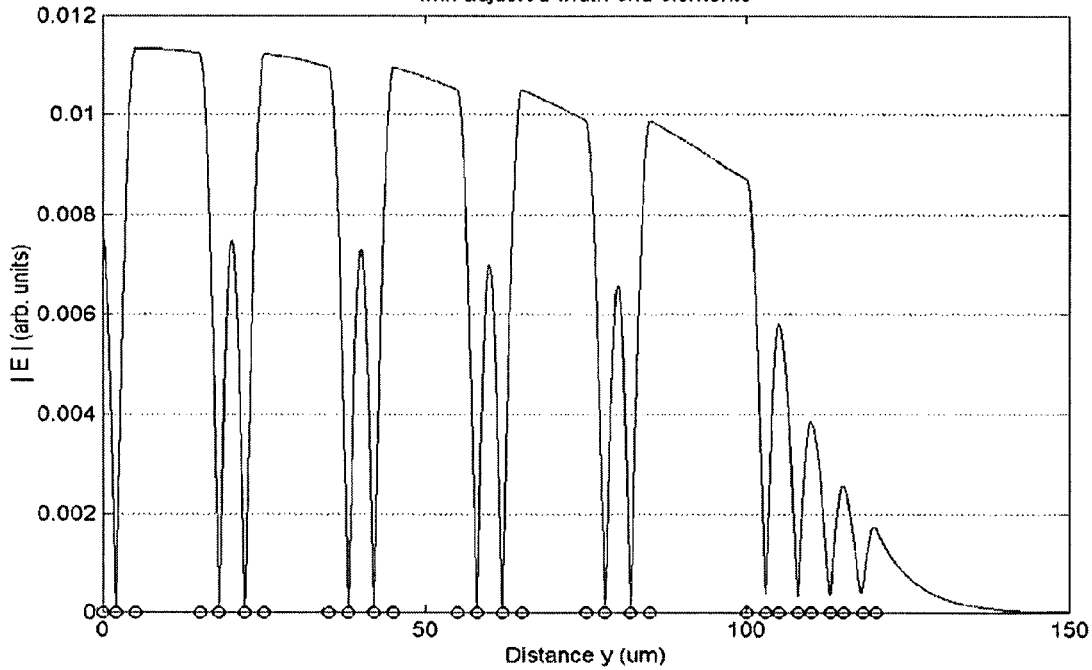
FIG. 25 is a graph of a modulus of the field distribution for the basic mode of the ten elements array with reflecting-filters, with in-phase coupling inter-elements and with adjusted width for the end elements.
Figure 26:
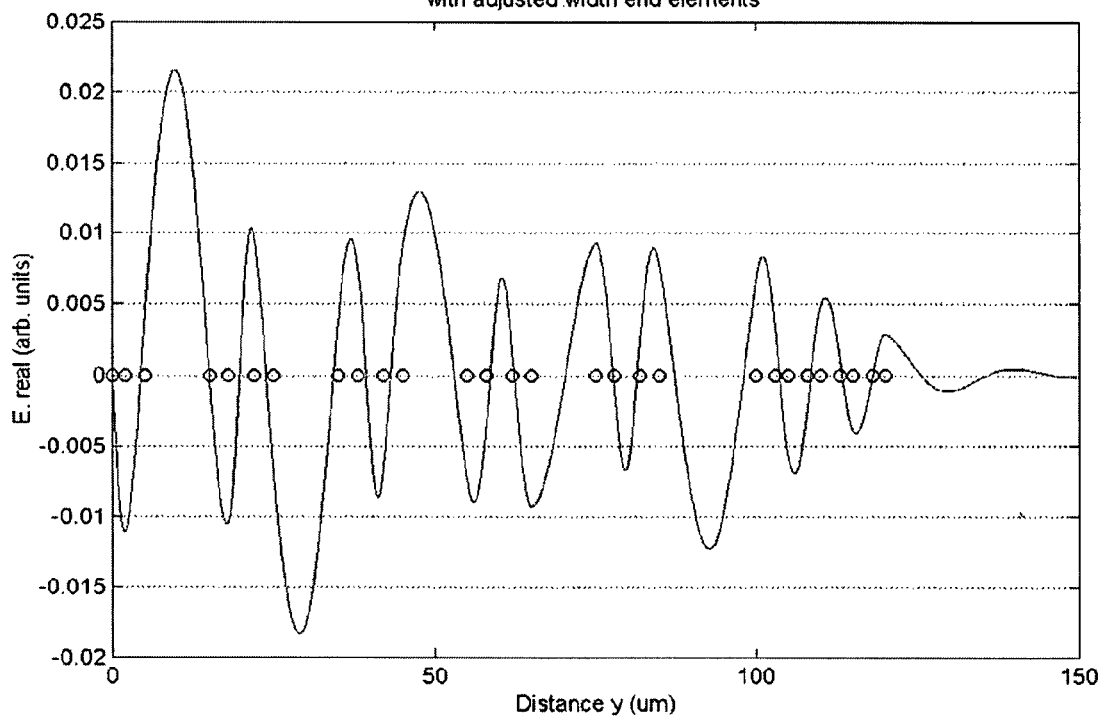
FIG. 26 is a graph of a field distribution for the OP mode of the ten elements array with reflecting-filters, with in-phase coupling inter-elements and with adjusted width for the end elements.

As stated before the basic mode is not fundamentally disturbed if the widths of one or more of its elements are changed. The adjustment in table 8 changes only the width of the lateral end elements (considered from the center to the margins) form 10 μm to 15 μm. FIG. 25 presents the basic super-mode for an array designed with data in Table 7 and 8. FIG. 26 presents the OP mode for the same structure. The basic super-mode in FIG. 25 is very similar to the basic super-mode in FIG. 22. A bigger difference can be seen for the OP super-mode of FIGS. 24 and 26. The larger lateral end element induces a larger field magnitude at the reflector-filter external margin interface. The absorption in the margin segment increases and the basic mode has now a 3% relative gain advantage compared with the OP super-mode A higher thermal flux flow in the lateral end elements has a secondary benefit effect, that of equalizing the thermal distribution.

The basic super-mode of FIG. 22 has an intrinsic unpleasant feature: the field magnitude is not exactly equal from one element to another. This can be corrected with a higher contrast between the (Lo, Hi) layers, as shown in Table 9. In this table the widths of the Lo Hi sub-segments were changed from 3 and 2 μm to 3.5 and 1.5 μm, respectively, and the effective refractive indexes were changed accordingly.

TABLE 9

Constructive parameters for a 10 elements array with lateral reflecting filters and in phase coupling inter-elements. Higher contrast between (Lo, Hi) pairs ($\lambda = 1$ μm)

| Segments | effective refractive indexes | Λs (μm) | widths w (μm) | repetition |
|---|---|---|---|---|
| elements | $3.2 - i \times 0.5 \times 10^{-4}$ | | 10 | 10 times |
| inter-elements (formed of Lo and Hi sub-segments) | | | 3.5 + 1.5 + 1.5 + 3.5 | 9 times |
| Lo inter-element sub-segment | $3.20079 = \text{sqrt}(3.2^2 + 14^{-2})$ | 14 | 3.5 | 2 times in each inter-element |
| Hi inter-element sub-segment | $3.20433 = \text{sqrt}(3.2^2 + 6^{-2})$ | 6 | 1.5 | 2 times in each inter-element |
| Reflecting filter (formed of Lo and Hi sub-segments) | | | | |
| Lo reflecting-filter sub-segment | $3.20079 = \text{sqrt}(3.2^2 + 14^{-2})$ | 14 | 3.5 | 4 times in each reflecting filter |
| Hi reflecting filter sub-segment | $3.20433 = \text{sqrt}(3.2^2 + 6^{-2})$ | 6 | 1.5 | 4 times in each reflecting filter |
| margin segment | $3.2 + i \times 2.0 \times 10^{-4}$ | | >=50 | |

Figure 27:
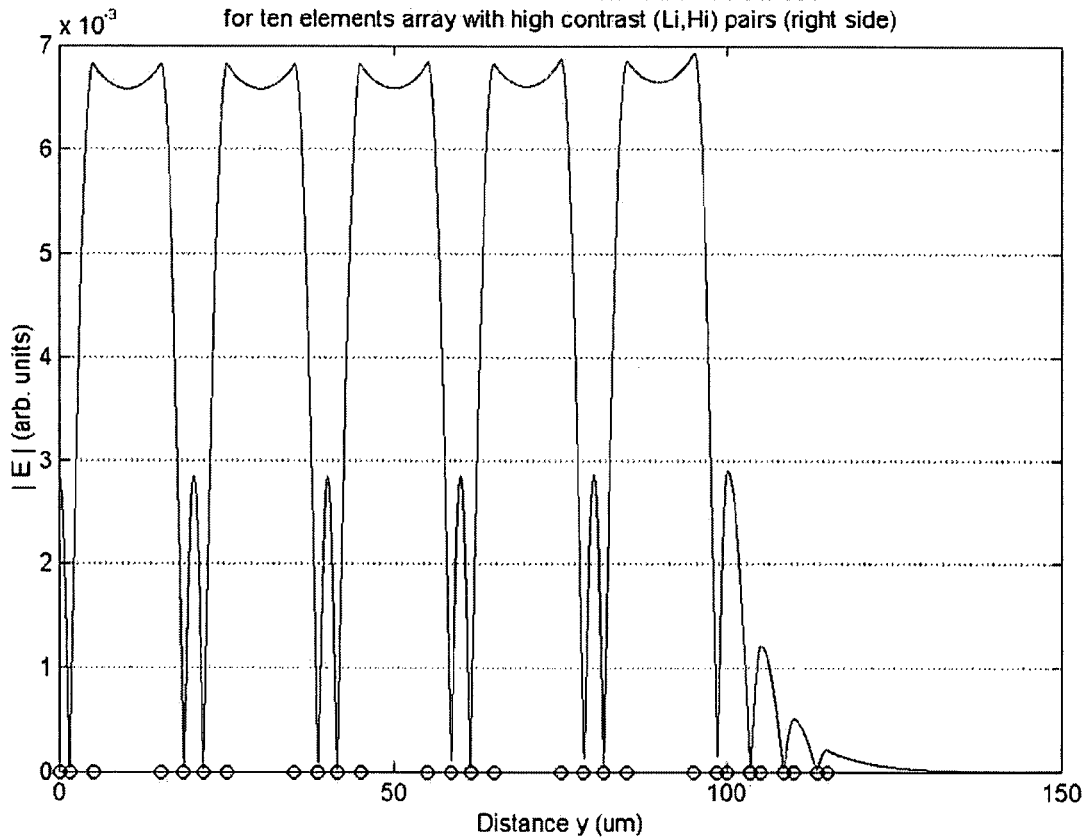
FIG. 27 is a graph of a modulus of the field distribution for the basic mode of the ten elements array structure with reflecting-filters and with in-phase coupling inter-elements that both have higher contrast between sub-segments.

The basic mode field distribution is presented in FIG. 27. A higher contrast reflector-filter has equalized the field magnitudes from one element to the other. In the mean time the gain advantage of the basic mode relative to the next adjacent one has been reduced to 1%.

The Sixth Example

Flat Field Distributions in Each Element and Almost Equal Amplitudes from One Element to the Other in a Ten Elements Array, with Adjusted Attenuators and with Out of Phase Coupling Inter-Elements

It is naturally to try to implement a scheme for the element coupling, using as inter-elements the segments types from the second single element example. The simplest way is to use a (HI, LO, LO, HI) structure for the inter-elements. Such a structure would couple an element flat field distribution with the flat field distribution in adjacent elements and would be symmetrical relative to the middle of each inter-element. The fact is that this type of array will always oscillate in the OP mode that has a gain advantage over the fundamental mode.

Figure 28:
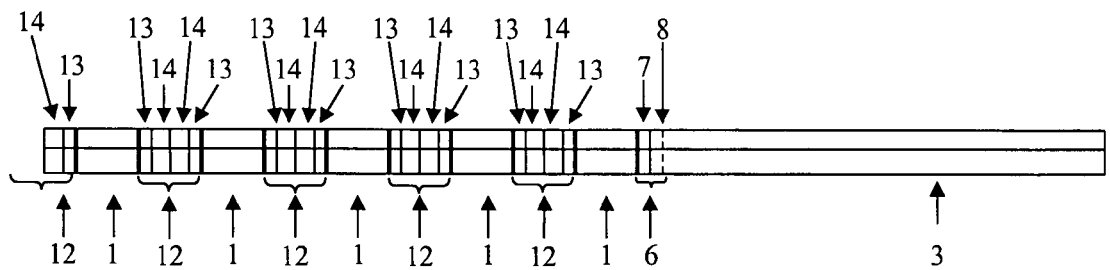
FIG. 28 is a layout of an effective refractive index profile for the structure with ten elements array with adjusted attenuators and with out of phase coupling inter-elements.
Figure 29:
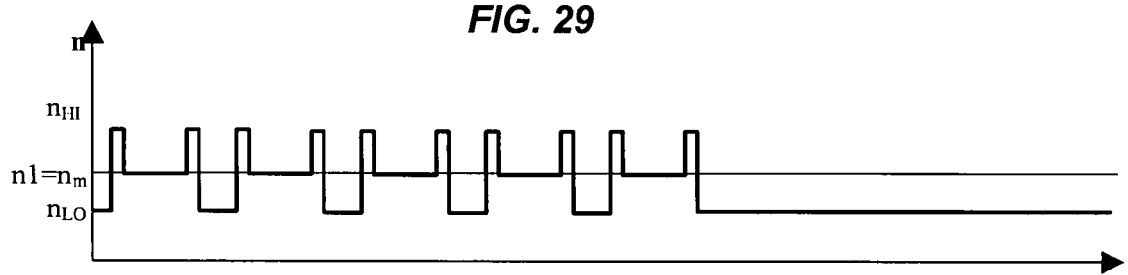
FIG. 29 is a graph of an effective refractive index profile for the ten elements array structure with adjusted attenuators and with out of phase coupling inter-elements.

Since the OP mode can not be avoided, an other strategy can be used. Accept the OP mode and optimize the structure for this OP mode. A ten elements structure is presented in FIG. 28. It has the inter-elements adjusted to couple out of phase the flat field distribution in each element to the flat field distribution in an adjacent element. FIG. 28 shows only the right side of the array, i.e, 5 elements only. The depicted structure starts at the origin with the middle of the fifth inter-element segment. The real part of the effective refractive index is presented in FIG. 29. The design parameters are given in Table 10. The constructive parameters are given for an emission wavelength $\lambda=1$ μm.

The array comprises active elements 1, inter-elements 12 situated between each pair of elements, two systems of segments that form the adjusted attenuators 6 and 6', adjacent to the end active elements, and two margin segments 3 and 3', each externally adjacent to its corresponding adjusted attenuator. As before, the segment systems for the adjusted attenuators comprise sub-segments 7, 8, 7' and 7'. The inter-elements comprise sub-segments 13 and 14. These sub-segments can be of the type 7 and 8 (or 7' and 8'), i.e. the HI, LO sub-segments in the inter-elements have the same transversal structure as the HI, LO sub-segments in the adjusted attenuator. This choice minimizes the number of types for transversal segments.

The field distributions in sub-segments 13 are parts of cosine functions; the field distributions in sub-segments 14 are parts of hyperbolic sinuses. The cosine functions are characterized by a lateral wavelength $\Lambda_{HI}=\lambda/\text{sqrt}(n_{LO}^2-n_1.\text{real}^2)$; the hyperbolic sinuses are characterized by a lateral characteristic length $\Lambda_{LO}=1/\text{sqrt}(n_1.\text{real}^2-n_{LO}^2)$.

The chosen values of $n_{HI}$ correspond to $\Lambda_{HI}=16$ μm. The chosen value for $w_{HI}$, $w_{HI}=2$ μm, corresponds to $\Lambda_{HI}/8$.

The widths for the sub-segments 14, $w_{Lo}$ are chosen at 3 μm. $\Lambda_{LO}$ will be chosen in such a way that the field distribution starts flat at the beginning of sub-segment 13, have a smooth transition at 13-14 interfaces and ends with a zero value at the end of 14 sub-segments, i.e. in the middle of each inter-element. This adjustment process is fulfilled by the condition:

$$(1/\Lambda_{HI})\tan(2\pi w_{HI}/\Lambda_{HI}) = (1/\Lambda_{LO})1/\tan h(2\pi w_{Lo}/\Lambda_{LO}) \quad (13)$$

$\Lambda_{LO}$ given by (13) is 25.33 μm and corresponds to $n_{LO}=3.19975$.

The chosen values for (HI, LO, LO, HI) inter-element parameters assure a connection between elements where each have a flat field distribution inside and an opposite phase to each other.

The functionality of a (HI, LO, LO, HI) quartet is similar to the functionality if a (Lo, Hi) pair. An even number of quartets will assure an in phase connection between elements. An odd number of quartets will assure an anti-phase connection between elements.

The adjusted attenuators at the exterior of the last elements comprise one pair (HI, LO), as in the third example. The fact is that an adjusted attenuator with evanescent decay, as in third example, works better than the an adjusted attenuator terminated with an absorption margin, as in second example A design step in the adjusted attenuator is necessary to assure equal amplitudes from one element to the other. As seen in Table 10 the margins are included and are extensions of LO sub-segments and the last LO sub-segments are extended to a few $\Lambda_{LO}$. To make a smooth connection from the cosine distribution in the end 7 (7') to the exponential decay in the end sub-segments 8 (8') the width of the last HI sub-segments, $w_{HIlast}$ are given by the condition:

$$w_{HIlast} = \lambda/(2\pi) a \tan(\Lambda_{HI}/\Lambda_{LO}) \quad (14)$$

$w_{HIlast}$ given by the relation (14) is 1.434 μm.

The same procedure for the adjustment of the last LO sub-segment can be applied to the single element devices described in the third example.

TABLE 10

Constructive parameters for a 10 elements array operating in OP mode with lateral adjusted attenuators and selective inter-elements. ($\lambda = 1$ μm)

| Segments | effective refractive indexes | $\Lambda$s (μm) | widths w (μm) | repetition |
|---|---|---|---|---|
| elements | $3.2 - i \times 0.5 \times 10^{-4}$ | | 10 | 10 times |
| inter-elements (formed of HI and LO sub-segments) | | | 2 + 3 + 3 + 2 | 9 times |
| HI inter-element sub-segment | $3.20061 = \text{sqrt}(3.2^2 + 1/16^2)$ | 16 | 2 | 2 times in each inter-element |
| LO inter-element sub-segment | $3.19975 = \text{sqrt}(3.2^2 - 1/25.33^2)$ | 25.33 | 3 | 2 times in each inter-element |
| adjusted attenuator (formed of HI and LO sub-segments) | | | | |
| adjusted last HI sub-segment | $3.20061 = \text{sqrt}(3.2^2 + 1/16^2)$ | 16 | 1.434 | once in each adjusted attenuator |
| extended LO end sub-segment | $3.19975 = \text{sqrt}(3.2^2 - 1/25.33^2)$ | 25.33 | a few $\Lambda_{LO}$ | once in each adjusted attenuator |
| margin segments | same as end LO | 25.33 | included in extended LO sub-segment | |

Figure 30:
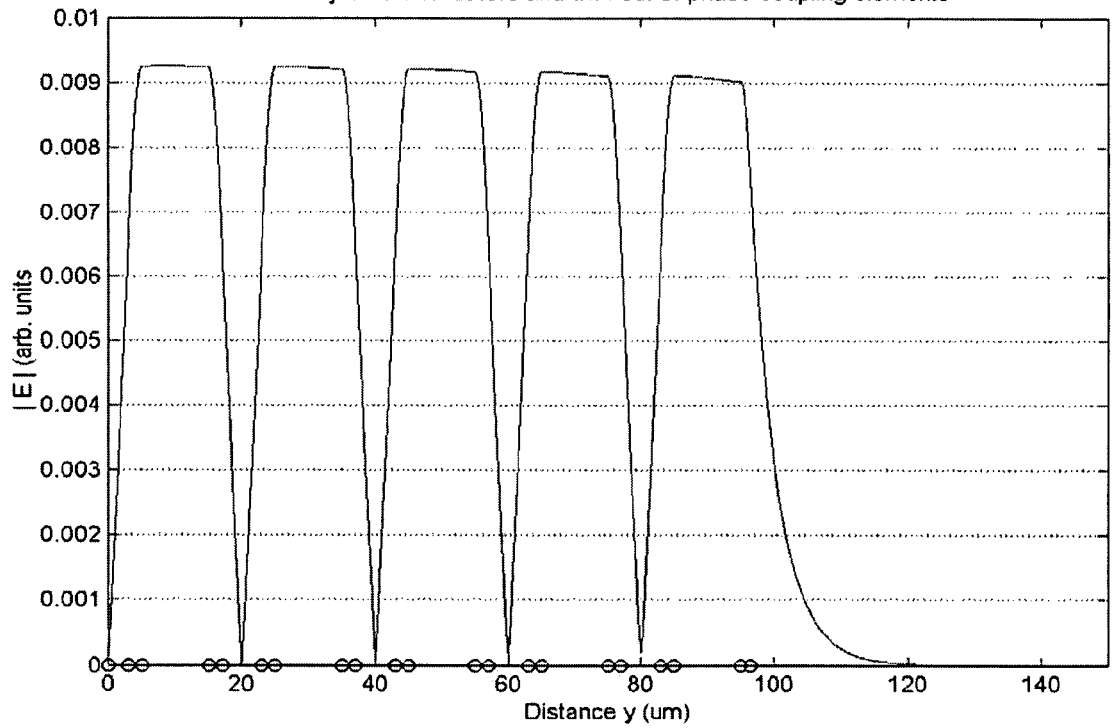
FIG. 30 is a graph of a modulus of the field distribution for the OP mode for the ten elements array with adjusted attenuators and with out of phase coupling inter-elements.

FIG. 30 presents the modulus of the field distribution for the OP mode for the structure described in Table 10. One can see that the mode has flat field amplitude in each element and almost equal amplitudes from one element to the other. The modal gain for this mode is 4.38 cm$^{-1}$. The most important property of the mode family for this structure (i.e. all super-modes) is that the next modal gain in the family is only 3.74 cm$^{-1}$, i.e. 17% less. A better mode discrimination of the OP mode against all other mode is the intrinsic property of this type of structure.

The sixth example with out of phase coupling inter-elements can be simplified using only the HI inter-element sub-segments. i. e. making $w_{LO}$=0. In this case the width of the joined Hi inter-element sub-segments should be w/$\Lambda_{HI}$=(2N+1)/2, where N is integer. The simplest case if for N=0, i. e. half lateral equivalent wavelenth.

The scheme of anti-symmetric field distribution in symmetric inter-elements can also be applied for array constructed with Lo and Hi sub-segments. In this case the reduced width for inter-elements should be an odd number of ½: Σ w/Λ=(2N+1)/2, where N is integer. An example of such inter-element is the (Lo, Hi)(Lo, Lo)(Hi, Lo) structure. The simplest case is for N=0, i. e. (Lo, Lo) or (Hi, Hi). (This simplest case is the same as the simplest case in precedent paragraph, i. e. half lateral equivalent wavelength.)

In any array with anti-symmetric field distribution and with only one zero in the middle of inter-elements (N=0) a region in the middle of the inter-elements can be made absorbing. This will enhance the modal selectivity.

The Seventh Example

Flat Envelope for the Field Intensity Distribution in a Ten Elements Array with Reflecting-Filter Boundaries and with Out of Phase Coupling Inter-Elements In the case of narrow elements, it is not so important to have the flat field in each element in order to obtain a good coupling between the field and gain profiles, but a flat peaks envelope remains a stringent condition.

In this example is described an array that is designed to operate in the out-of-phase preferred mode. It is a full periodic structure of active element segments separated by inter-element segments. Each spatial period of the structure, $P_s$, comprises one active element in the center of the period, and halves of the inter-element, on each side of the element. Between two adjacent elements there are two symmetric halves of inter-elements, one half from each adjacent period. The full periodic array ends with one half of an inter-element at one side and another half of an inter-element at the other side. (In former examples the end half inter-elements were not included in the end periods).

The preferred super-mode is sinusoidal and has a spatial period, $P_{pm}$, twice as large as the period $P_s$ of the periodic structure described above. Its period has two peaks of equal magnitude and opposite sign, each centered on one of the two adjacent elements. The middle and the ends of each preferred mode period are nodes of oscillation. The ends of the full periodic structure are also the location for nodes of oscillation of the preferred mode, for both cases in which the periodic structure contains either an even or an odd number of periods.

The role of real boundaries is to pin down these nodes. There are two types of real boundaries that can fulfill this task: the reflecting-filter and the evanescent decay attenuator.

Figure 31:
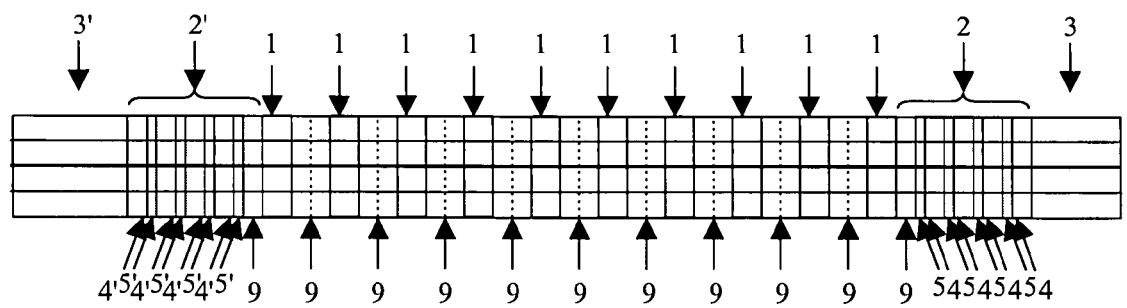
FIG. 31 is a layout of a segment structure of a less restrictive array with reflecting-filters.
Figure 32:
FIG. 32 is a graph of an effective refractive index profile for the less restrictive structure with reflecting-filters.

A ten elements structure is presented in FIG. 31. The real part of the refractive index profile is presented in FIG. 32. The constructive parameters for this array are given in Table. 11. The array comprises periodic active elements 1, inter-elements 9 situated between each pair of elements, two reflecting filter 2 and 2', adjacent to each end of the periodic structure, and two margin segments 3 and 3', each externally adjacent to the corresponding reflecting-filter. The segment systems comprise a multitude of sub-segments 5, 4, 5', 4', etc. They are of the type Hi (5 and 5') and Lo (4 and 4'). Compared with the order of these sub-segments in former example from FIG. 20, it seems that the order of (Hi, Lo) pair was reversed. This is due to the fact that the first Lo sub-segment of FIG. 20 in now included in the array period. The reflecting-filters can be named also lateral Bragg reflectors.

The role of the reflecting-filter systems of segments is to pin down the nodes of the preferred mode at the ends of the periodic structure. They comprise (Hi, Lo) sub-segments pairs. The preferred mode has an effective refractive index $n_{pref}$. For the preferred mode, the lateral wavelengths in the Hi and Lo sub-segments are defined relative to $n_{pref}$, the Hi sub-segments refractive index $n_{Hi}$, the Lo sub-segments refractive index $n_{Lo}$ and the free space wavelength λ:

$$\Lambda_i = \lambda/\text{sqrt}(n_i^2 - n\text{pref}^2) \quad (15)$$

where i stays for Hi or Lo.

To calculate $\Lambda_{Hi}$ and $\Lambda_{Lo}$ and then to design the widths of the Hi and Lo sub-segments, $w_{HI}$ and $w_{LO}$, the effective refractive index of the preferred mode, $n_{pref}$, should be known. It can be found by solving the eigen-value problem with periodic condition at the ends of the periodic structure, when the use of real boundaries is not necessary.

The reduced width of a sub-segment is the ratio $w_i/L_i$. The reflecting filter pins the nodes of the preferred mode at the ends of the periodic structure if each (Hi, Lo) pair has in total a reduced equivalent lateral wavelength of ½. The best situation is for the case when each sub-segment of the reflecting-filter is a quarter of the respective lateral wavelength.

The (Hi, Lo) structures end with absorbing margins. Their role is to attenuate the radiation field away of the array. The energy band gap for the absorbing margin segments should not greater than the energy band gap for the element segments, since the margins will become transparent.

The particular structure in Table 11 and in FIG. 31 is a simple one that has the same real refractive index for elements and inter-elements. Elements can have also either lower or higher refractive index than the inter-elements. In Table 11, the elements have negative imaginary parts for the refractive index, corresponding to gain, and the inter-elements refractive indexes have no imaginary parts. They could be designed with absorption, to increase the selection process. In this case their imaginary parts would be positive.

TABLE 11

Constructive parameters for a 10 elements array with lateral reflecting filters and out-of-phase coupling inter-elements ($\lambda = 1$ μm)

| Segments | Effective refractive indexes | $\Lambda$s (μm) | Widths w (μm) | w/$\Lambda$ | repetition |
|---|---|---|---|---|---|
| elements | $3.2 - i \times 0.5 \times 10^{-4}$ | | 3 | | |
| inter-elements | 3.2 | 8 | 4 | | |
| preferred mode | sqrt($3.2^2 - 1/14/14$) = 3.1992 | | | | |
| Hi reflecting-filter sub-segment | sqrt($n_{pref}^2 + 1/6/6$) = 3.2035 | 6 | 1.5 | ¼ | 4 times in each reflecting filter |
| Lo reflecting-filter sub-segment | sqrt($n_{pref}^2 + 1/8/8$) = 3.2016 | 8 | 2 | ¼ | 4 times in each reflecting filter |
| margin segments | $3.2 + i \times 2 \times 10^{-4}$ | | | | |

Figure 33:
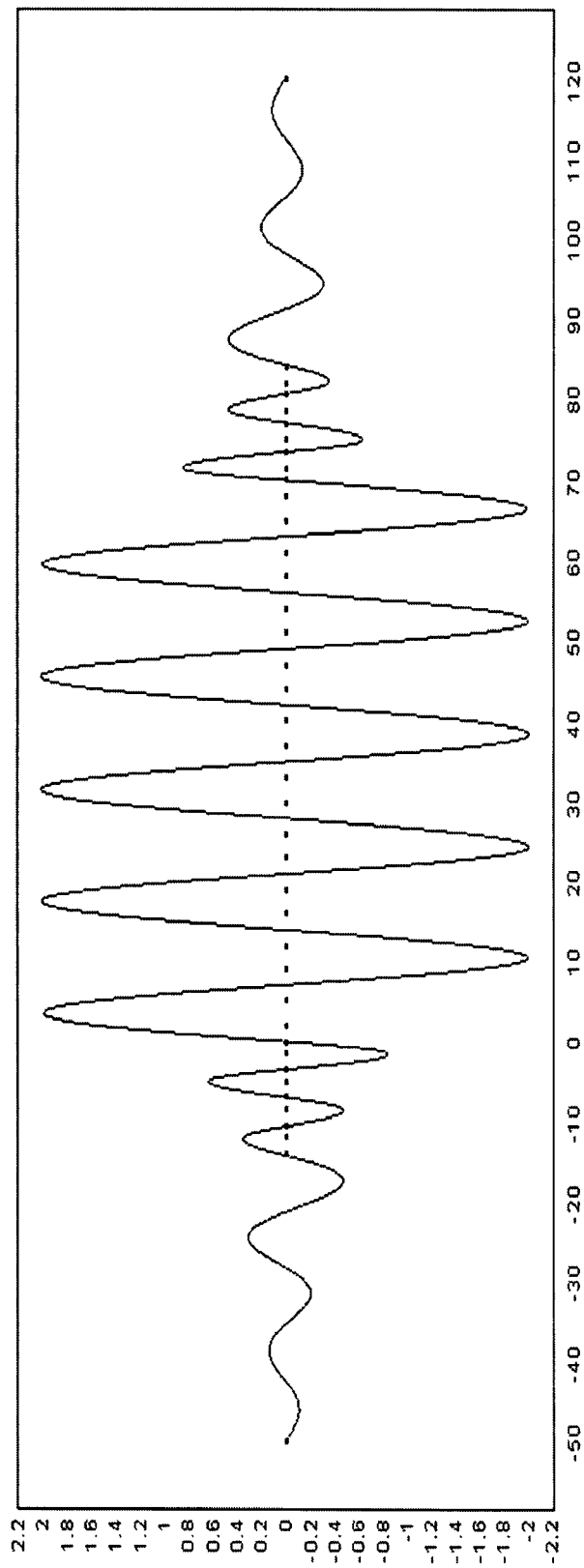
FIG. 33 is a graph of a preferred mode field distribution for the less restrictive structure with reflecting filters.

FIG. 33 depicts the preferred super-mode, mode no 9. It has 3.4 cm$^{-1}$ modal gain. The adjacent mode 10 has 1 cm$^{-1}$ modal gain. The adjacent mode 8 has 1.7 cm$^{-1}$ modal gain. The reflective-filter induces a high discrimination against both adjacent modes. Much higher order modes are highly discriminated since they penetrate much better the filter toward the absorption margins.

The Eight Example

Figure 34:
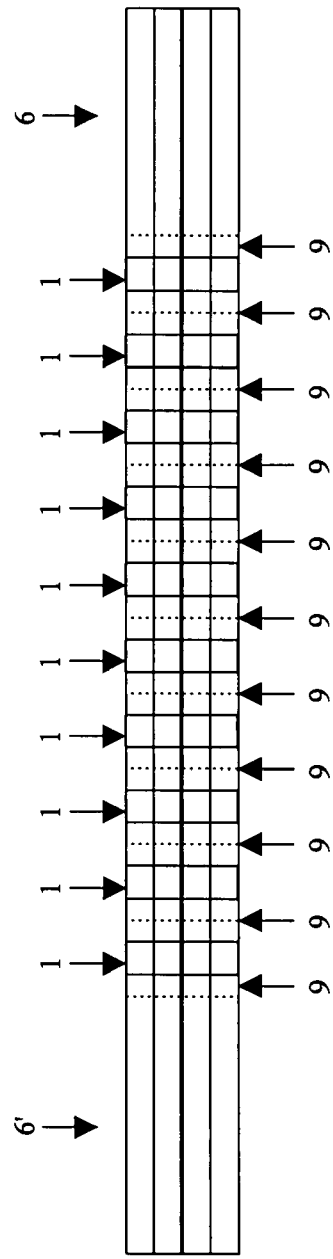
FIG. 34 is a layout of a segment structure of a less restrictive array with evanescent decay attenuators.
Figure 35:
FIG. 35 is a graph of an effective refractive index profile for the less restrictive structure with evanescent decay attenuators.

Flat Envelope for the Field Intensity Distribution in a Ten Elements Array with Evanescent Decay Attenuator Boundaries and with Out of Phase Coupling Inter-Elements A ten elements structure is presented in FIG. 34. The real part of the refractive index profile is presented in FIG. 35. The constructive parameters for this array are given in Table. 12. The array comprises periodic active elements 1, inter-elements 9 situated between each pair of elements, attenuator segments 6 and 6', adjacent to each end of the periodic structure.

Figure 36:
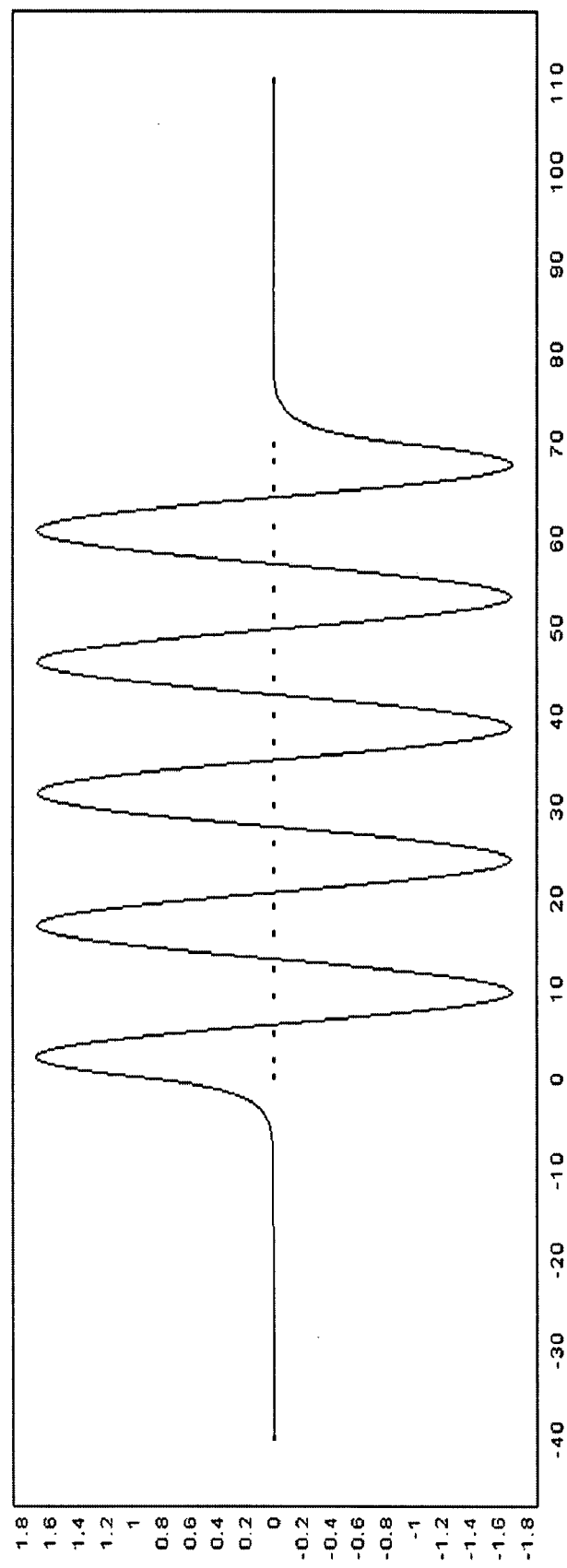
FIG. 36 is a graph of a preferred mode field distribution for the less restrictive structure with evanescent decay attenuators

The role of the evanescent decay attenuators is also to pin down the nodes of the preferred super-mode at the ends of the periodic structure. FIG. 36 depicts the field distribution for the preferred super-mode. The "pinning" is not as exact as in former example, but its effects are the same, since the preferred super-mode has equal amplitudes in each element. Each attenuator comprises a segment with refractive index lower than that of the preferred mode. The example will be again of a structure with equal refractive index in elements and inter-elements, the difference being in their imaginary parts. Elements can have also either lower or higher refractive index than the inter-elements.

The attenuator is an optical wall in which the field evanescently decays. In a sense it is a reflector with a broader reflectivity maximum than the reflecting filter. It also reflects super-modes with lower refractive indexes than the preferred super-mode refractive index. To avoid this, the attenuator refractive index should be not too low relative to the preferred mode refractive index. In this way, the high order super-modes, which have lower refractive indexes than the preferred mode, will be leaky modes and will be discriminated.

TABLE 12

Constructive parameters for a 10 elements array with lateral evanescent decay attenuators and out-of-phase coupling inter-elements ($\lambda = 1$ μm)

| Segments | Effective refractive indexes | $\Lambda$s (μm) | Widths w (μm) | w/$\Lambda$ |
|---|---|---|---|---|
| elements | $3.2 - i \times .5 \times 10^{-4}$ | | 3 | |
| inter-elements | 3.2 | 8 | 4 | |
| attenuator segments | 3.1975 | | | |

The preferred super-mode is mode no. 9. It has 4 cm$^{-1}$ modal gain. The adjacent mode 10 has 1.4 cm$^{-1}$ modal gain. The adjacent mode 8 has 2.95 cm$^{-1}$ modal gain. The reflective-filter induced a high discrimination against both adjacent modes. Higher order modes are highly discriminated since they become leaky.

The Ninth Example

Figure 37:
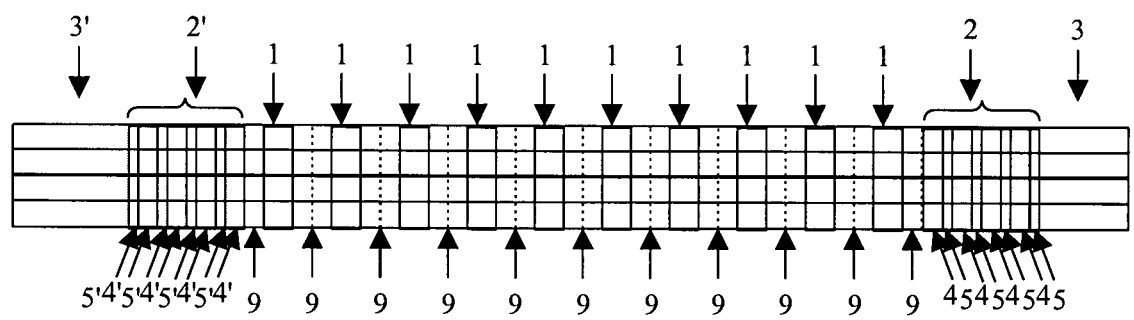
FIG. 37 is a layout of a segment structure of an array with shifted reflecting-filters.
Figure 38:
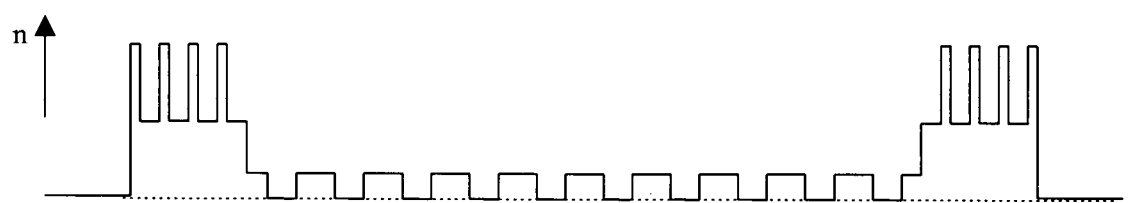
FIG. 38 is a graph of an effective refractive index profile for the structure with shifted reflecting-filters.

Flat Envelope for the Field Distribution in a Ten Elements Array with Shifted Reflecting-Filter Boundaries and with Out of Phase Coupling Inter-Elements A ten elements structure is presented in FIG. 37. The real part of the refractive index profile is presented in FIG. 38. The constructive parameters for this array are given in Table. 13. The array comprises periodic active elements 1, inter-elements 9 situated between each pair of elements, two reflecting filter 2 and 2', adjacent to each end of the periodic structure, and two margin segments 3 and 3', each externally adjacent to the corresponding reflecting-filter. The segment systems comprise a multitude of sub-segments 4, 5, 4', 5', etc. They are of the type Lo (4 and 4') and Hi (5 and 5').

The (Lo, Hi) reflecting filter structure, as opposite to the (Hi, Lo) reflecting filter structure of the seventh example, can pin the node at the periodic structure ends, if $\Lambda_{Lo}$ and $\Lambda_{Hi}$ are calculated with a different reference refractive index $n_{ref}$, instead of $n_{pref}$:

$$\Lambda_i = \lambda/\text{sqrt}(n_i^2 - n_{ref}^2) \tag{16}$$

where i stays for Hi or Lo.

In this sense the reflecting-filter is shifted from $n_{pref}$. The periodic structure in Table 13 is intended for providing flat field intensity in each element since the real part of the preferred mode refractive index is equal to the real part of the element refractive index. The inter-element refractive index provides the correct phasing between elements. The reference refractive index $n_{ref}$ is 3.20107. The shift of the reference refractive index assures a better discrimination for higher order adjacent modes than other types of real boundaries for flat intensity envelope arrays.

The (Lo, Hi) structures end with absorbing margins. Their role is to attenuate the radiation field away of the array. The energy band gap for the absorbing margin segments should not greater than the energy band gap for the element segments.

TABLE 13

Constructive parameters for a 10 elements array with lateral shifted reflecting filters and out-of-phase coupling inter-elements ($\lambda = 1$ µm)

| Segments | Effective refractive indexes | $\Lambda$s (µm) | Widths w (µm) | w/$\Lambda$ | repetition |
|---|---|---|---|---|---|
| elements | $3.2 - i \times .5 \times 10^{-4}$ | | 3 | | |
| inter-elements | $\sqrt{3.2^2 + 1/8/8} = 3.2024$ | 8 | 4 | | |
| preferred mode | 3.2 | | | | |
| reference | 3.20107 | | | | |
| Lo reflecting-filter sub-segment | $\sqrt{n_{pref}^2 + 1/8/8} = 3.2035$ | 8 | 2 | ¼ | 4 times in each reflecting filter |
| Hi reflecting-filter sub-segment | $\sqrt{n_{pref}^2 + 1//6/6} = 3.2054$ | 6 | 1.5 | ¼ | 4 times in each reflecting filter |
| margin segments | $3.2 + i \times 2 \times 10^{-4}$ | | | | |

Figure 39:
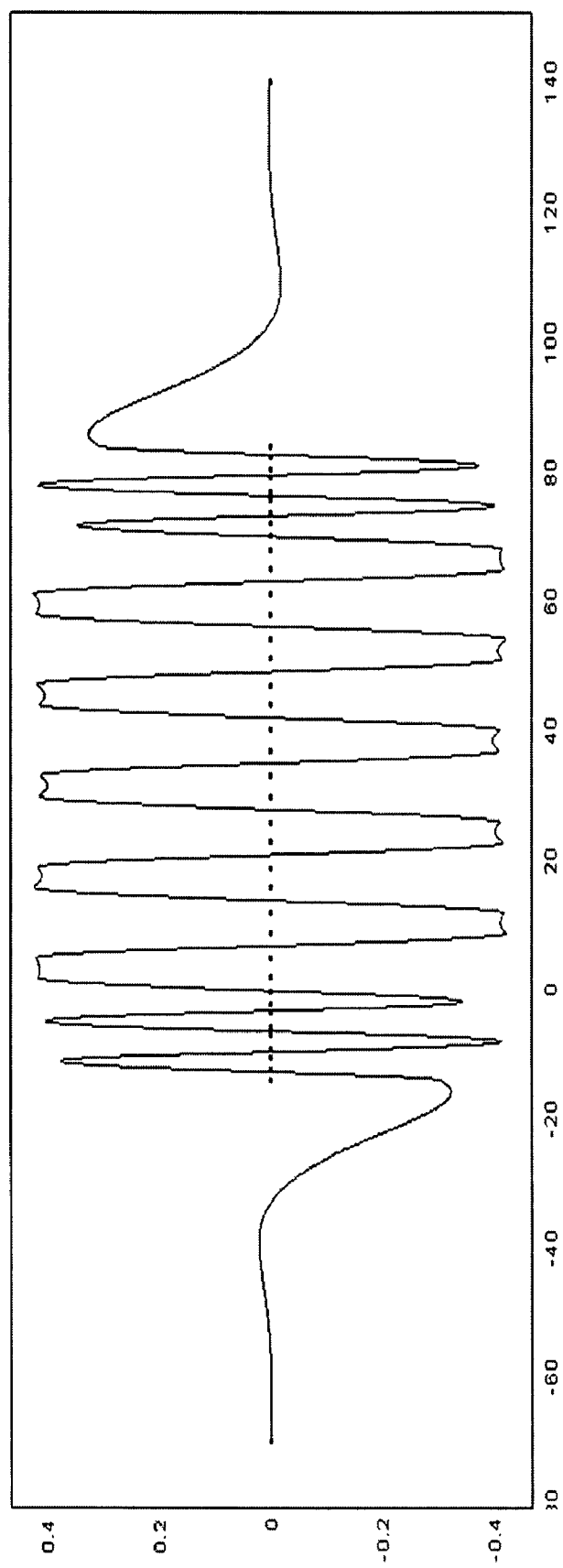
FIG. 39 is a graph of a preferred mode field distribution for the structure with shifted reflecting filters.

FIG. 39 depicts the preferred super-mode, mode no 9. It has 3.2 cm$^{-1}$ modal gain. The adjacent mode 10 has 1.6 cm$^{-1}$ modal gain. The adjacent mode 8 has 0.5 cm$^{-1}$ modal gain. The reflective-filter induced a high discrimination against both adjacent modes. Higher order modes are highly discriminated since they become very leaky.

Shortcuts and Improvements

The nine examples given above represent a wide selection of devices according to the invention. They all have either flat field distributions in the active segment or, in the case of arrays, at least equal field amplitudes from one element to the other.

As many people in the field will do, applicant has thought of ways to improve the design either by shortcuts (i. e. simplifying the structure by reducing the number of elements) or by improvements (i.e. better performances at the expense of introducing more elements). A few improvements are described below.

One may think to extend the overall widths of the inter-elements, to avoid a too great thermal load. Increasing the inter-element $\Lambda$s increase the inter-element widths, but this will decrease the differences in effective refractive indexes relative to the main elements. A reasonable difference is necessary to diminish the negative influence of thermal effects, of imprecision in execution etc.

Another way is to increase the number of sub-segments in inter-elements, whose overall equivalent thickness could be (N+1) equivalent wavelengths for the in-phase coupling of the fifth example and in and (2N+1)/2 equivalent wavelengths for the simplified out of phase coupling of the sixth example, where N>=0. These structures should be symmetric (anti-symmetric) relative to the middle of the inter-element for structures with in-phase coupling (out of phase coupling).

One can further think to have all sub-segments in inter-elements of the same type. This was already proposed for the sixth to the ninth examples for the out of phase coupling. This will increase the confinement factor of inter-element and reduce correspondingly the confinement factor for the active elements. Nevertheless, two kinds of sub-segments are necessary in the reflecting-filter to attenuate the field toward the margins. Without the attenuation the OP mode will have a greater gain advantage. Two kinds of sub-segments are also preferable in inter-elements to reduce the inter-elements confinement factor.

A lateral structure similar to the in-phase coupling of the fifths example but with evanescent attenuation instead of absorption attenuation can work. Such a structure will need the fourths type of transversal segments for the evanescent decay.

A lateral structure for in-phase coupling of the fifths example with evanescent decay and with only three types of transversal segments can be designed, using a single Hi type of sub-segments in inter-elements and an adjusted attenuator as in sixth example, where the HI sub-element in attenuator is of the same type as the Hi type in inter-elements. Such a structure will have the following segments: reference, HI (=Hi) and LO.

Other combinations between fifths and sixth structures can be designed at the expense of introducing more types of (sub-)segments.

The margin segments, producing attenuation either by absorption or evanescently, have an essential role in terminating the field distribution. There are alternative ways to terminate the structure, exactly at chip margins, with either "perfect" lateral mirror or with "perfect" lateral absorber.

In the case of "perfect" mirror the best is to interrupt the array and the chip in the interior of an element, where the field was supposedly flat. Introducing at chip margins perfect mirrors will keep the preferred field distribution inside of the array. There is the danger that perfect mirror will enhance internal circulating modes. Taking this into consideration, the "perfect" mirror should be perfect only for wave vector with small $k_y$ components, as is the case with these arrays, and be less reflective for wave vectors with large $k_y$ components, as the internal circulating modes have. An essential step in fabricating such mirror is to introduce flat surfaces perpendicular to the wafer plane. Processing steps such as cleaving or ion etching can make such surfaces. Further processing steps are needed to introduce the k vector selectivity.

A "perfect" lateral mirror can work also if it is situated exactly at the interface of a Lo, Hi sequence, where the field should be flat. This exact positioning of the "perfect" lateral mirror needs very exact wafer processing.

A "perfect" absorber can also work if introduced at points where the field distribution goes through a zero value. The "perfect" absorber needs also very exact positioning.

The structures described in all examples work also well as amplifiers. In the case of array amplifiers, the signal can be introduced into one element and from there to be spread laterally in whole structure.

The strong coupling between elements is useful in another way for the laser oscillators case. An array laser can be constructed, which has HR mirror in the back, very low reflectivity AR mirror in the front and somewhat higher reflectivity for only one element in array. This last element will act as a master oscillator; the others elements will act as laterally coupled slaves into a two-pass amplifier.

Transversal Epitaxial Structures

People knowledgeable in the field will be skeptical about the precision with which the epitaxial transversal structures can be fabricated. There are two problems to be addressed: the dimensional precision of each segment and the precision for the values of each effective refractive index.

To address the first problem a good start is to use wider sub-segments both in inter-elements and in reflecting filters or in adjusted attenuators. Wider sub-segments can be done with larger values for the lateral $\Lambda$s, i. e. with smaller values for the differences in effective refractive indexes.

The differences in the effective refractive indexes from one segment to the other should be nevertheless greater than variations in effective refractive index induced by gain during operation. These variations can be attenuated in transversal structures with low confinement factor $\Gamma$.

The active elements in the previous example were unusually wide. There are two reasons to make active elements wide. First, they should have the same scale with wider sub-segments in inter-elements, in reflecting filters or in adjusted attenuators. Second, since the field distribution is flat in active elements, the filament formation is delayed. The filament formation is further delayed in lasers with low modal gain.

It was already suggested that low modal gain devices are preferred. In previous examples they have a net threshold gain of about 4-4.5 $cm^{-1}$. Lower modal gain can be sustained in long lasers. If the back reflector has a reflectivity of 100% and the front reflector has a reflectivity of 3%, this gain covers the mirror losses if the resonator has a length equal to 4-4.4 mm. The gain of the active region, which intrinsically is about 600-1200 $cm^{-1}$ needs to be reduced to its value of about 6.28 $cm^{-1}$, incorporated in the imaginary part of effective refractive index of the active elements. The reduction in element gain is obtained in transversal structures with low confinement factor $\Gamma$ of about 0.5-1%.

To avoid unnecessary losses the inter-elements, the reflecting-filters and the adjusted attenuators should be preferably transparent to the laser radiation. An exception is for the simplest out of phase coupling structures (the sixth to ninth examples) where is reasonable to include an absorbing region in the middle of the inter-element, where the field is zero). Disordering of the QW active region and the etching of the active region followed by regrowth can produce transparent transversal structures. For both processes it is preferable to use structures with the QW active region close to the surface of the epitaxially grown wafer.

The preferred choice for structures with low confinement factor $\Gamma$ and with QW active region closer to the surface of the epitaxially grown wafer is represented by the asymmetric structures with an active wave-guide separated from the main wave-guide of the transversal structure. This type of structure with two wave-guides has intrinsically a low confinement factor since the transversal field distribution is shifted toward the main wave-guide, apart from the active region. They have also the QW closer to the surface of the epitaxially grown wafer. Modifying some of the layers, possible including the QW, that are laid exterior to the main wave-guide, one can create different transversal structures that have a relatively small difference in effective refractive index. These transversal structures have overlapping coefficient close to one, since they share a common wave-guide. The overlapping coefficient is defined as the integral over the x space of the product of two normalized field distributions in two segments. The effective refractive index method works better if overlapping coefficients are closer to one. Choosing a particular type of structure does not restricts the generality of this invention. It applies to other types of structures including, but not limited to, symmetric structures among them.

The transversal structures will be described as an example in the $Al_xGa_{1-x}As$ system, with a 7 nm InGaAs QW, operating at 1 µm emission wavelength. x is the composition index. The confinement factor is 0.75%. The wavelength is very close to the 0.970-0.980 µm wavelengths used for pumping. Choosing a particular wavelength and a particular material system does not mean the applicant restricts the generality of this invention. It applies to other materials and wavelengths.

For each of the following examples, a functional collection of three structures will be presented, not only the active structure in element segments.

Figure 40:
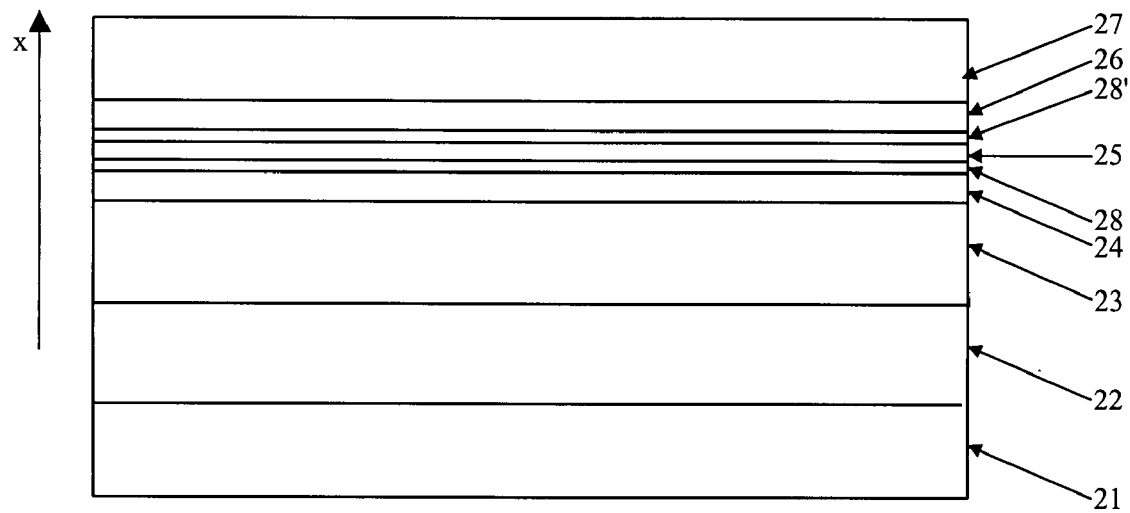
FIG. 40 is a layout of a reference transversal structure for a structure collection comprising reference, Lo, Hi structures, based on a two wave-guides transversal structure (not at scale).
Figure 41:
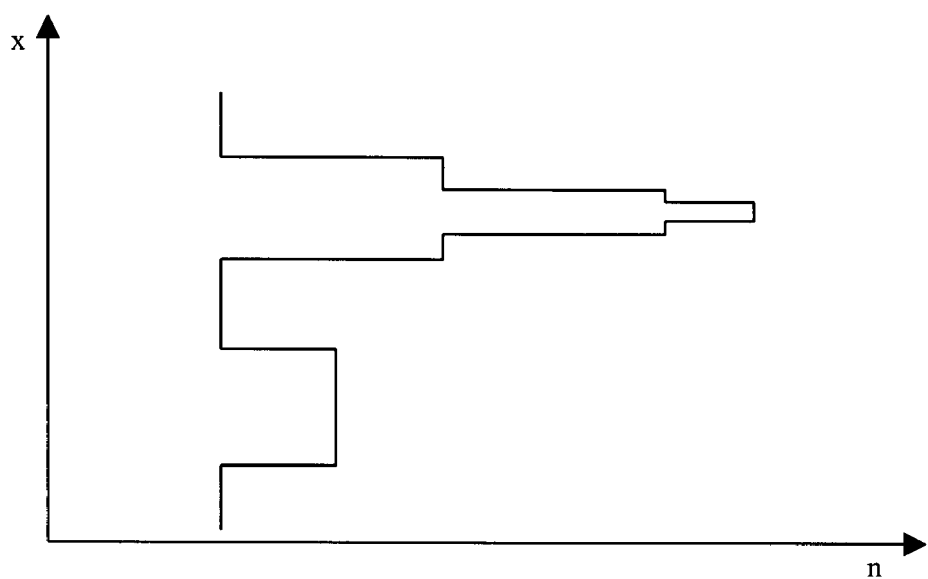
FIG. 41 is a graph of a refractive index profile for the reference structure with two wave-guides (not at scale).

The First Example for the Transversal Structure for the Segment Collection Reference Lo And Hi Segments Obtained by the QW Wave-Guide Modification The collection can be used for the first and the fifth examples for lateral structures. A similar collection can be used for the seventh example. The segment collection comprises three types of structures: reference (for elements), Lo and Hi. To avoid excessive processing only two out of three structures in segment collection should be obtained by processing at wafer level. FIG. 40 shows the layers of a transversal structure, which is a reference structure for this example. FIG. 41 shows the profile of the refractive index for the reference structure. The reference structure is of the type with two waveguides. The constructive parameters of the reference structure are given in Table 14. The constructive parameters for the Lo and Hi structures, layer thicknesses and composition indexes, are given in Table 15.

From the bottom up, the reference transversal structure comprises an n type cladding 21, a main wave-guide 22, a first intermediate layer 23, a first (n) part of an active region wave-guide 24, an active region 25, a second (p) part of the active region wave-guide 26, a p cladding 27. Other layers can be included: a substrate, a contact layer, barrier layers surrounding the QW, a second intermediate layer between the wave-guide and the p cladding, stop etch layers, graded layers between each transition from a lower band gap material to a higher band gap material. The FIG. 40 and Table 14 includes two barrier layers 28 and 28', which are usually used for 980 nm lasers. The main wave-guide 22 is also named optical trap. In FIG. 40 the active region comprises a single QW. There are possible structures with active region formed with multiple QWs.

Figure 42:
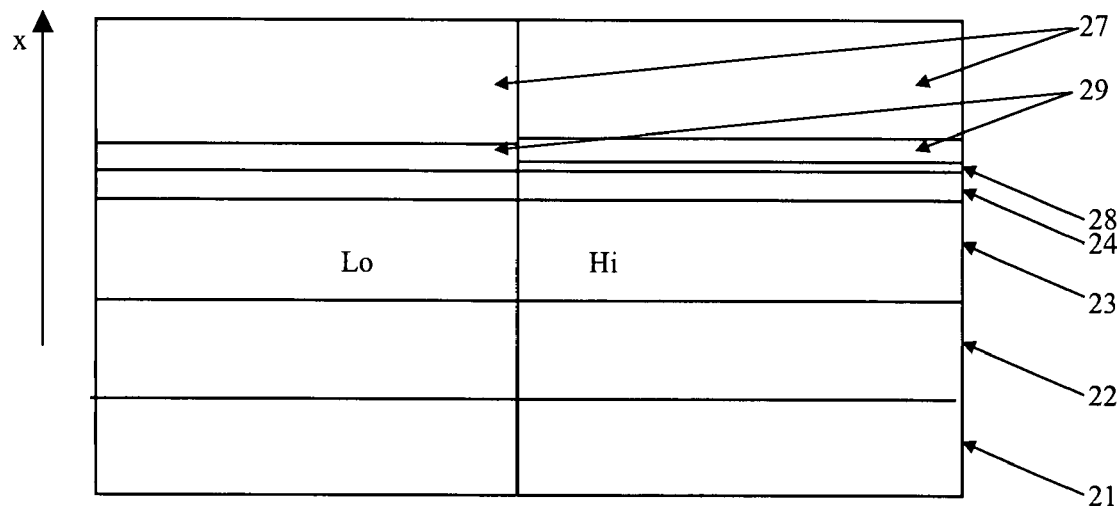
FIG. 42 is a layout of Lo and Hi structures with replacement layers for the collection of reference, Lo, Hi structures.

The Hi and Lo structures are shown in FIG. 42. The QW, the p side barrier, the p side active region wave-guide and the n side barrier (the last one only in the case of Lo structure) were replaced. Instead a replacement wave-guide 29 was introduced. This layer has a relatively high refractive index, but is transparent to the radiation emitted in elements.

In this example the Lo and Hi transversal structures can be obtained by etching followed by regrowth. For the Hi structure transversal etching is down to the QW, inclusive. For the Lo transversal structure etching is down to the n side barrier, inclusive. The etching is followed by the regrowth of the replacement wave-guide layer 29, which is followed by the regrowth of the p cladding 27. In this example the replacement wave-guide is made of the same material as the p side barrier. In Table 15, the cells with replacement layers are shadowed.

One can obtain the structure in this example by growing in a first growth step all layers up to and including the p active region wave-guide. Then this layer is controlled etched for all three types of structure at different thickness (including zero thickness for the reference structure). A second step growth for the p cladding completes the wafer processing.

In some of the further examples, instead describing the etch-regrowth process, only modifications of the reference structure by replacement layers will be shown. Different processing methods can be adopted, as summarized at the end of this specification.

TABLE 14

Constructive parameters for the first reference transversal structure

| Layer name | n clad | main wave guide | first intermediate | n act. reg. wave guide | n side barrier | QW | p side barrier | p act. reg. wave guide | p clad |
|---|---|---|---|---|---|---|---|---|---|
| Layer # | 21 | 22 | 23 | 24 | 28 | 25 | 28' | 26 | 27 |
| Thickness (μm) | 2 | 0.2 | 0.2 | 0.03 | 0.004 | 0.007 | 0.004 | 0.03 | 1.5 |
| Comp. index x | 0.55 | 0.40 | 0.55 | 0.3 | 0 | * | 0 | 0.3 | 0.60 |

In composition and strain of QW adjusted for emission wavelength.

TABLE 15

Constructive parameters for Hi and Lo structures

| Layer name | n clad | main wave guide | first intermediate | n act. reg wave guide | n side barrier | QW | p side barrier | replacement wave guide | p clad |
|---|---|---|---|---|---|---|---|---|---|
| Layer # | 21 | 22 | 23 | 24 | 28 | 25 | 28' | 29 | 27 |
| Hi structure | | | | | | | | | |
| Thickness (μm) | 2 | 0.2 | 0.2 | 0.03 | 0.004 | | | 0.034 | 1.5 |
| Comp. index x | 0.55 | 0.40 | 0.55 | 0.3 | 0 | | | 0 | 0.6 |
| Lo structure | | | | | | | | | |
| Thickness (μm) | 2 | 0.2 | 0.2 | 0.03 | | | | 0.034 | 1.5 |
| Comp. index x | 0.55 | 0.40 | 0.55 | 0.3 | | | | 0 | 0.6 |

The reference structure has a confinement factor $\Gamma=0.75\%$. The effective refractive indexes for all three structures are given in Table 16. The last row shows the differences in effective refractive indexes relative to the reference structure.

TABLE 16

Effective refractive indexes for reference, Hi and Lo structures

| Structure | reference | Hi | Lo |
|---|---|---|---|
| n | 3.22081 | 3.22327 | 3.22185 |
| $\Delta n = n - n_{ref}$ | 0 | 0.00246 | 0.00104 |

The values in Table 16 depend in a certain extent on the knowledge of optical properties of materials included in each structure. Experimental work should be done to adjust the Δn values to the value required in the design of the lateral structures.

The Second Example for the Transversal Structure for the Segment Collection: Reference, Lo and Hi Segments Obtained by Variations of a Controlling Wave-Guide The structure collection is designed for the first and the fifth examples for lateral structures. A similar example can be used for the seventh example. The reference transversal structure is the same as that in previous example. The Lo and Hi structures are variations of the reference structure. They include a controlling wave-guide 30' and/or 30'+30" beside the main wave-guide and the active region wave-guide. The controlling wave-guide is inserted in the p cladding and splits the p cladding wave-guide 27 in two parts 27' and 27". The third controlling wave-guide comprise two parts, 30' and 30", for the Hi structure, and only one part 30' for the Lo structure.

Figure 43:
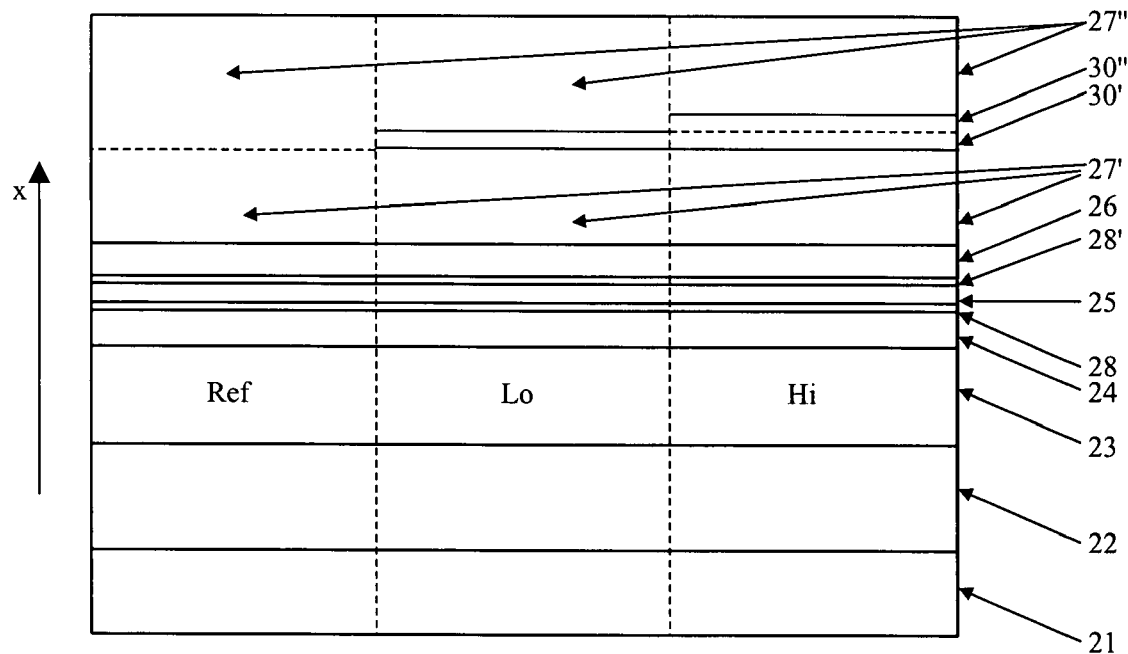
FIG. 43 is a layout of a collection of reference, Lo and Hi structures that include a third controlling wave-guide.

FIG. 43 presents the reference, the Lo and the Hi structures for this example. The constructive parameters are presented in Table 17. The alterations in the Lo and Hi structures relative to the reference are shown in shadowed cells.

TABLE 17

Constructive parameters for the second example transversal structures

| Layer name | n clad | main wave guide | first inter. | n act. reg wave guide | n side barrier | QW | p side barrier | p act. reg wave guide | p clad 1st part | third wave-guide 1st part | third wave-guide 2nd part | p clad 2st part |
|---|---|---|---|---|---|---|---|---|---|---|---|---|
| Reference strcture | | | | | | | | | | | | |
| Layer # | 21 | 22 | 23 | 24 | 28 | 25 | 28' | 26 | 27' | — | — | 27" |
| Thickness (μm) | 2 | 0.2 | 0.2 | 0.03 | 0.004 | 0.007 | 0.004 | 0.04 | 0.3 | — | — | 1.2 |
| Comp. index x | 0.55 | 0.40 | 0.55 | 0.3 | 0 | * | 0 | 0.3 | | — | — | 0.60 |
| Lo strct. | | | | | | | | | | | | |
| Layer # | 21 | 22 | 23 | 24 | 28 | 25 | 28' | 26 | 27' | 30' | — | 27" |
| Thickness (μm) | 2 | 0.2 | 0.2 | 0.03 | 0.004 | 0.007 | 0.004 | 0.04 | 0.3 | 0.023 | — | 1.2 |
| Comp. index x | 0.55 | 0.40 | 0.55 | 0.3 | 0 | ** | 0 | 0.3 | 0.6 | 0.0 | — | 0.6 |
| Hi strct. | | | | | | | | | | | | |
| Layer # | 21 | 22 | 23 | 24 | 28 | 25 | 28' | 26 | 27' | 30' | 30" | 27" |
| Thickness (μm) | 2 | 0.2 | 0.2 | 0.03 | 0.004 | 0.007 | 0.004 | 0.04 | 0.3 | 0.023 | 0.018 | 1.2 |
| Comp. index x | 0.55 | 0.40 | 0.55 | 0.3 | 0 | ** | 0 | 0.3 | 0.6 | 0.0 | 0.0 | 0.6 |

*In composition and strain of QW adjusted for emission wavelength
**QW band gap can be shifted up for transparency The effective refractive indexes for all three structures are given in Table 18. The last row shows the differences in effective refractive indexes relative to the reference structure.

TABLE 18

Effective refractive indexes for reference, Hi and Lo structures

| Structure | reference | Hi | Lo |
|---|---|---|---|
| n | 3.22081 | 3.22324 | 3.22190 |
| Δn = n − n$_{ref}$ | 0 | 0.00243 | 0.00109 |

The values in Table 18 depend in a certain extent on the knowledge of optical properties of materials included in each structure. Experimental work should be done to adjust the Δn values to the value required in the design of the lateral structures.

One can obtain the structure in this example by growing in a first growth step all layers up to and including the controlling wave-guide. Then this layer is controlled etched for all three types of structure at different thickness (including zero thickness for the reference structure). A second step growth for the second part of the p cladding completes the wafer processing. It is preferred that the QW band gaps in Lo and Hi structure to be shifted up for transparency.

The Third Example for the Transversal Structure for the Segment Collection: Reference Lo and Hi Segments Obtained by QW Wave-Guide Modifications The structure collection is designed for the sixth example of lateral structures. A similar structure can be used for the eighth example. The reference transversal structure for this example is very similar to the structure presented in the first example. Only the barriers are reduced from 4 nm to 3 nm. The LO and HI are obtained replacing top layers in a way similar to the replacement in the first example. The constructive parameters of the reference structure are given in Table 19. The constructive parameters for the LO and HI structures are given in Table 20.

TABLE 19

Constructive parameters for the second reference transversal structure

| Layer name | n clad | main wave guide | first intermediate | n act. reg. wave guide | n side barrier | QW | p side barrier | p act. reg. wave guide | p clad |
|---|---|---|---|---|---|---|---|---|---|
| Layer # | 21 | 22 | 23 | 24 | 28 | 25 | 28' | 26 | 27 |
| Thickness (μm) | 2 | 0.2 | 0.2 | 0.03 | 0.003 | 0.007 | 0.003 | 0.03 | 1.5 |
| Comp. index x | 0.55 | 0.40 | 0.55 | 0.3 | 0 | * | 0 | 0.3 | 0.60 |

* In composition and strain of QW adjusted for emission wavelength

TABLE 20

Constructive parameters for HI and LO structures

| Layer name | n clad | main wave guide | first intermediate | n act. reg wave guide | n side barrier | QW | p side barrier | replacement wave guide | p clad |
|---|---|---|---|---|---|---|---|---|---|
| Layer # | 21 | 22 | 23 | 24 | 28 | 25 | 28' | 29 | 27 |
| HI struc. | | | | | | | | | |
| Thickness (μm) | 2 | 0.2 | 0.2 | 0.03 | 0.003 | | | 0.028 | 1.5 |
| Comp. index x | 0.55 | 0.40 | 0.55 | 0.3 | 0 | | | 0 | 0.6 |
| LO struc. | | | | | | | | | |
| Thickness (μm) | 2 | 0.2 | 0.2 | 0.03 | | | | 0.028 | 1.5 |
| Comp. index x | 0.55 | 0.40 | 0.55 | 0.3 | | | | 0 | 0.6 |

The effective refractive indexes for all three structures are given in Table 21. The last row shows the differences in effective refractive indexes relative to the reference structure.

TABLE 21

Effective refractive indexes for reference, HI and LO structures

| Structure | reference | HI | LO |
|---|---|---|---|
| n | 3.22017 | 3.22084 | 3.2199 |
| $\Delta n = n - n_{ref}$ | 0 | 0.00067 | −0.00027 |

As mentioned before, the values in Table 21 depend in a certain extent on the knowledge of optical properties of materials included in each structure. Experimental work should be done to adjust the Δn values to the value required in the design of the lateral structures.

Figure 44:
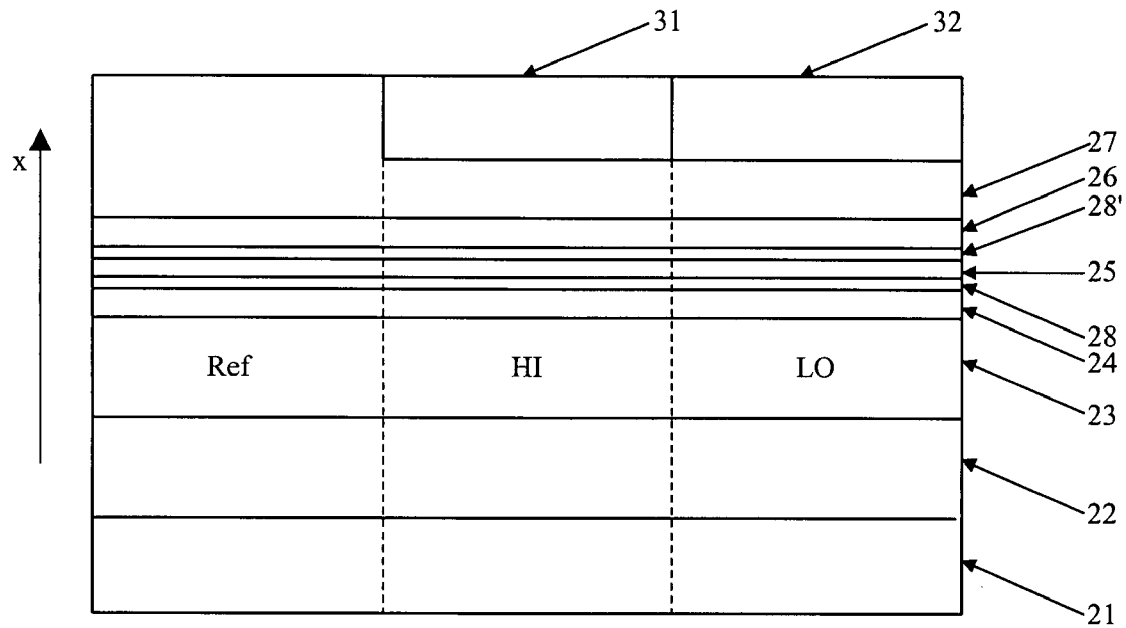
FIG. 44 is a layout of a collection of reference, LO and HI structures, with different composition for the second part of the p cladding.

The Forth Example for the Transversal Structure for the Segment Collection: Reference, Lo and Hi Segments Obtained by p Cladding Modifications The structure collection is designed for the sixth example of lateral structures. A similar structure can be used for the eighth example. The reference transversal structure for this example is the same with the structure presented in the previous example in Table 19. Compared with the reference structure, the other segment structures, LO and HI, have replacement layers. All three types of transversal structures are presented in FIG. 44. In this example the QW and the active region wave-guide are not replaced. Only the top p cladding is different from one structure to the other. The top of the reference p cladding is replaced with two types of replacement p claddings, 31 for HI structure, and 32, for LO structure. The constructive parameters of the reference structure are given in Table 20. The constructive parameters for the LO and HI structures are given in Table 22.

The QW in LO and HI structures can be made transparent to the radiation emitted by the active elements by a disordering process. Disordering can be better accomplished before the replacement p cladding layers where grown.

TABLE 22

Constructive parameters for the forth example; the HI and LO transversal structure

| Layer name | n clad | main wave guide | first interm. | n act. reG. wave guide | n side barrier | QW | p side barrier | p act. reG. wave guide | p clad | p clad replace. |
|---|---|---|---|---|---|---|---|---|---|---|
| HI struct. | | | | | | | | | | |
| Layer # | 21 | 22 | 23 | 24 | 28 | 25 | 28' | 26 | 27 | 31 |
| Thickness (μm) | 2 | 0.2 | 0.2 | 0.03 | 0.003 | 0.007 | 0.003 | 0.04 | 0.3 | 1.2 |
| Comp. index x | 0.55 | 0.40 | 0.55 | 0.3 | 0 | * | 0 | 0.3 | 0.60 | 0.55 |
| LO struct. | | | | | | | | | | |
| Layer # | 21 | 22 | 23 | 24 | 28 | 25 | 28' | 26 | 27 | 32 |
| Thickness (μm) | 2 | 0.2 | 0.2 | 0.03 | 0.003 | 0.007 | 0.003 | 0.04 | 0.3 | 1.2 |
| Comp. index x | 0.55 | 0.40 | 0.55 | 0.3 | 0 | * | 0 | 0.3 | 0.60 | 0.64 |

*disordered QW

The effective refractive indexes for all three structures are given in Table 23. The last row shows the differences in effective refractive indexes relative to the reference structure.

TABLE 23

Effective refractive indexes for reference, HI and LO structures

| Structure | reference | HI | LO |
|---|---|---|---|
| n | 3.22017 | 3.22077 | 3.21990 |
| $\Delta n = n - n_{ref}$ | 0 | 0.00060 | −0.00023 |

As stated before, the values in Table 20 depend in a certain extent on the knowledge of optical properties of materials included in each structure. Experimental work should be done to adjust the $\Delta n$ values to the value required in the design of the lateral structures.

Figure 45:
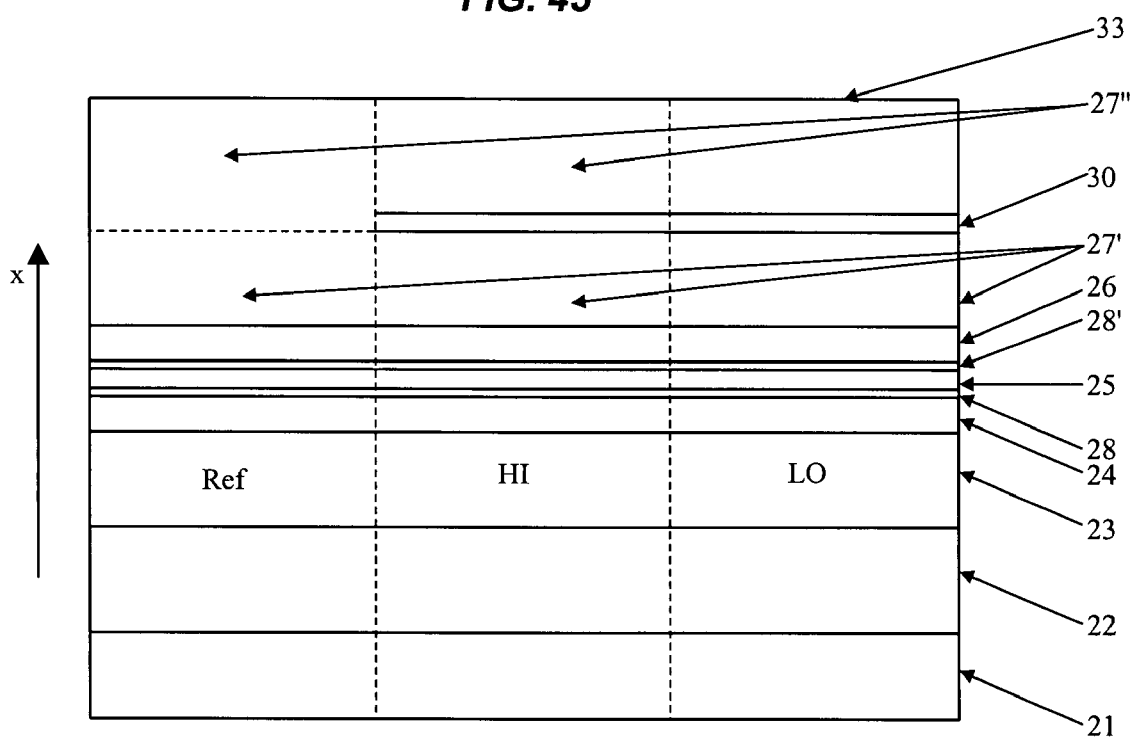
FIG. 45 is a layout of a collection of reference, LO and HI structures with different composition for the second part of the p cladding and that include a controlling wave-guide.

The Fifth Example for the Transversal Structure for the Segment Collection: Reference, Lo and Hi Segments Obtained with a Common Controlling Wave-Guide and p Cladding Modifications The structure collection is designed for the element segments for the sixth example of lateral structures. A similar structure can be used for the eighth example. The reference transversal structure for this example is the same with the structure presented in the previous examples in Table 19. All three types of transversal structures are presented in FIG. 45. In this example the QW and the active region wave-guide are not replaced. The top p cladding is replaced for the LO structure with a replacement layer 33. Both LO and HI structures include a third, controlling wave-guide 30, with a common thickness. The constructive parameters of the reference structure are given in Table 20. The constructive parameters for the LO and HI structures are given in Table 24.

The effective refractive indexes for all three structures are given in Table 25. The last row shows the differences in effective refractive indexes relative to the reference structure.

TABLE 25

Effective refractive indexes for reference, HI and LO structures

| Structure | reference | HI | LO |
|---|---|---|---|
| n | 3.22017 | 3.22076 | 3.21990 |
| $\Delta n = n - n_{ref}$ | 0 | 0.00059 | −0.00027 |

As mentioned before, the values in Table 25 depend in a certain extent on the knowledge of optical properties of materials included in each structure. Experimental work should be done to adjust the $\Delta n$ values to the value required in the design of the lateral structures.

Figure 46:
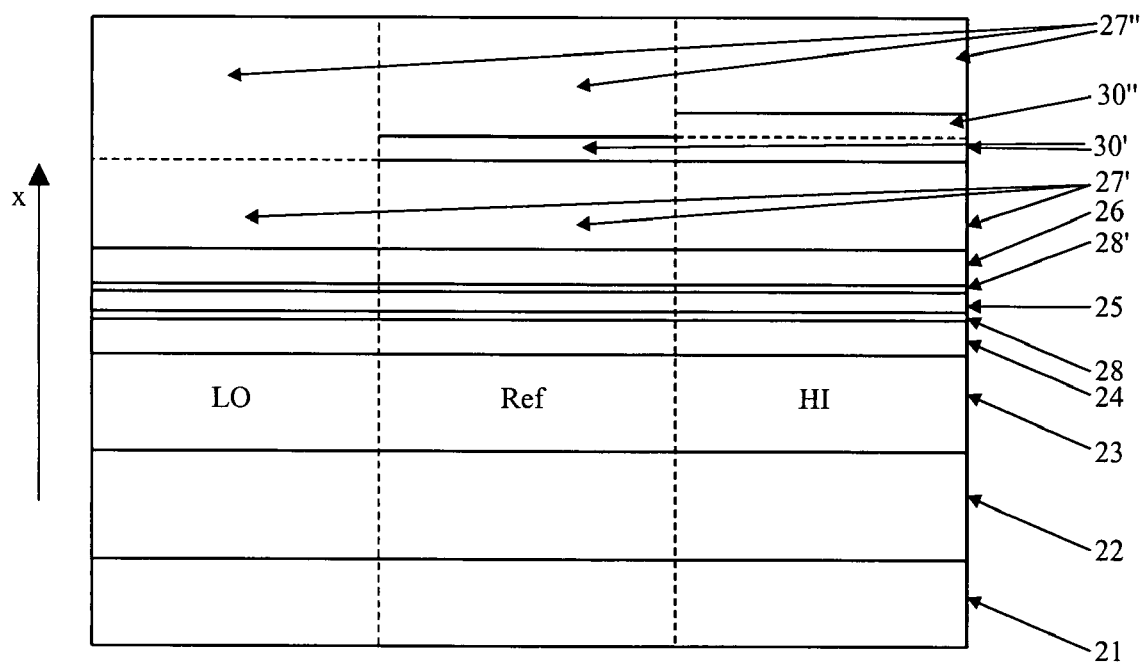
FIG. 46 is a layout of a collection of reference, LO and HI structures, with a controlling waveguide in reference and HI segments.

The Sixth Example for the Transversal Structure for the Segment Collection: Lo, Reference and Hi Segments Obtained by Variations of a Controlling Wave-Guide The structure collection is designed for the sixth example of lateral structures. A similar structure can be used for the eighth example. The reference transversal structure for this example is similar the structure presented in the previous examples, only it include a controlling wave-guide 30'. The HI structure includes the controlling wave-guide 30' and a supplementary one 30". This controlling wave-guide can miss from the LO structure. All three types of transversal structures are presented in FIG. 46. In this example the QW and the active region wave-guide are not replaced. The constructive parameters for the reference, LO and HI structures are given in Table 26.

TABLE 24

Constructive parameters for the fifth example LO and HI transversal structures

| Layer name | n clad | main wave guide | first inter. | n act. reg wave guide | n side barrier | QW | p side barrier | p act. reg wave guide | p clad first part | third wave-guide | p clad second part |
|---|---|---|---|---|---|---|---|---|---|---|---|
| LO strct. | | | | | | | | | | | |
| Layer # | 21 | 22 | 23 | 24 | 28 | 25 | 28' | 26 | 27' | 30 | 33 |
| Thickness (μm) | 2 | 0.2 | 0.2 | 0.03 | 0.004 | 0.007 | 0.004 | 0.03 | 0.2 | 0.0075 | 1.3 |
| Comp. index x | 0.55 | 0.40 | 0.55 | 0.3 | 0 | ** | 0 | 0.3 | 0.6 | 0.0 | 0.66 |
| HI strct. | | | | | | | | | | | |
| Layer # | 21 | 22 | 23 | 24 | 28 | 25 | 28' | 26 | 27' | 30 | 27" |
| Thickness (μm) | 2 | 0.2 | 0.2 | 0.03 | 0.004 | 0.007 | 0.004 | 0.03 | 0.2 | 0.0075 | 1.3 |
| Comp. index x | 0.55 | 0.40 | 0.55 | 0.3 | 0 | ** | 0 | 0.3 | 0.6 | 0.0 | 0.6 |

**QW band gap can be shifted up for transparency

TABLE 26

Constructive parameters for the sixth example reference, LO and HI transversal structure

| Layer name | n clad | main wave guide | first inter. | n act. reg wave guide | n side barrier | QW | p side barrier | p act. reg wave guide | p clad 1st | third wave-guide 1st part | third wave-guide 2nd part | p clad 2nd part |
|---|---|---|---|---|---|---|---|---|---|---|---|---|
| reference strct. | | | | | | | | | | | | |
| Layer # | 21 | 22 | 23 | 24 | 28 | 25 | 28' | 26 | 27' | 30' | | 27" |
| Thickness (μm) | 2 | 0.2 | 0.2 | 0.03 | 0.004 | 0.007 | 0.004 | 0.04 | 0.3 | 0.003 | | 1.3 |
| Comp. index x | 0.55 | 0.40 | 0.55 | 0.3 | 0 | | 0 | 0.3 | 0.6 | 0.0 | | 0.6 |
| LO strct. | | | | | | | | | | | | |
| Layer # | 21 | 22 | 23 | 24 | 28 | 25 | 28' | 26 | 27' | | | |
| Thickness (μm) | 2 | 0.2 | 0.2 | 0.03 | 0.004 | 0.007 | 0.004 | 0.04 | 0.2 | | | |
| Comp. index x | 0.55 | 0.40 | 0.55 | 0.3 | 0 | ** | 0 | 0.3 | 0.6 | | | |
| HI strct. | | | | | | | | | | | | |
| Layer # | 21 | 22 | 23 | 24 | 28 | 25 | 28' | 26 | 27' | 30' | 30" | 27" |
| Thickness (μm) | 2 | 0.2 | 0.2 | 0.03 | 0.004 | 0.007 | 0.004 | 0.04 | 0.2 | 0.003 | 0.008 | 1.3 |
| Comp. index x | 0.55 | 0.40 | 0.55 | 0.3 | 0 | ** | 0 | 0.3 | 0.6 | 0.0 | | 0.6 |

**QW band gap can be shifted up for transparency

The effective refractive indexes for all three structures are given in Table 27. The last row shows the differences in effective refractive indexes relative to the reference structure.

TABLE 27

Effective refractive indexes for reference, HI and LO structures

| Structure | reference | HI | LO |
|---|---|---|---|
| n | 3.22040 | 3.22106 | 3.22017 |
| $\Delta n = n - n_{ref}$ | 0 | 0.00064 | −0.00023 |

As stated before, the values in Table 27 depend in a certain extent on the knowledge of optical properties of materials included in each structure. Experimental work should be done to adjust the Δn values to the value required in the design of the lateral structures.

All structures in this example would start with the HI structure. Then the second part of the p cladding 27" is etched in places were reference and LO structures should be. A second etch for the controlling wave-guide is done in places where the reference should be. A third etch is done for the 30' layer of the LO structure. Stop etch layers could be introduced for exact stopping of etch processes. The second part of the p clad 27" is regrown to reconstruct the reference and the LO structures.

This structure can be obtained by a first step growth of all layers up to and including the controlling wave-guide. Then this layer is controlled etched for all three types of structure. A second step growth for the second part of the p cladding complete the wafer processing It is preferred that the QW band gaps in Lo and Hi structure to be shifted up for transparency.

Methods to Obtain Functional Structure Collections

The collection examples presented above suggested various methods to obtain different structures collections by wafer processing. Most of the methods use controlled etching for the different types of segments, i. e. etch stops at different depths. For controlled etching stop-etch layers can be included in design.

Listed below are the methods that may be employed to accomplish the desired results.

Multiple Regrowths for the p Cladding

This method was suggested in the forth collection example. Multiple regrowth can be done after a first growth was ended with the first part of the p cladding. Three selective regrowths are then necessary, one for each type of segments. Multiple regrowths can be also done after one sub-segment was fully grown and then partially etched to allow for two other selective regrowths.

Controlled Etching of the Controlling Wave-Guide

This method was suggested for the second, fifth and sixth collection examples. On a completely grown wafer different etching depths can be used for two different segments. This processing step is followed by a single regrowth of a second part of a common p cladding.

Controlled Etching of the Active Region Wave-Guide

This method was suggested in the first and third collection example. On a completely grown wafer different etching depths can be used for two different segments. This processing step is followed by a single regrowth of a common replacement wave-guide and the replacement p cladding. It has the advantage that completely removes the QW for better transparency.

First Step Growth, Controlled Etching for the Controlling Wave-Guide

For the second and sixth examples a first partial growth can be stopped after the controlling wave-guide was grown. Different thickness can be etched from the controlling wave-guide for two type of segments (including the zero thickness). A single common second step growth for the second part of the p cladding is necessary for all three types of segments. It is beneficial that this second growth is done on a smoother surface.

The etching of a controlling wave-guide after a first partial growth, can be done also for the fifth collection example. In this case a two-step selective regrowths are necessary for the second part of the p cladding.

What is claimed is:

1. A diode laser array type of device comprising a structure of lateral segments that comprises a multitudes of element segments, a multitude of inter element segments, the segments of these two multitudes being interlaced and forming an interlaced structure, said interlaced structure being a periodic structure, said element segment containing an active region that can be electrically excited, said active regions having the function of generating laser radiation that extends laterally in the whole lateral segment structure as field distributions for lateral modes wherein the said structure of lateral segments comprises also real boundary segments at the margins of said interlaced periodic structures; each period of the said interlaced periodic structure comprises an element segment in the center and halves of said inter-element segments at each side of said element segments; the segments of said interlaced periodic structure have equal real part of the effective refractive index and said segments are similar one to the other from the point of view of the distribution of a radiation field in a transversal direction; said real boundary segments act as evanescent decay attenuators that imposes boundary nodes for said field distributions of said lateral modes at the end of the said periodic interlaced structure and attenuates said field distribution outside of said periodic interlaced structure and among said lateral modes there is a preferred lateral mode, said preferred mode having a sinusoidal shape of the amplitude of its field distribution between said boundary nodes of said interlaced periodic structure, having a flat envelope for the intensity of its field distribution and being attenuated beyond said boundary nodes, each peak of said sinusoidal distribution being located at the center of one said active element segment, such that said preferred mode couples best with the gain provided by the excitation of said multitude of active element segments, that makes said preferred mode to be highly discriminated against all other modes.

2. A diode laser array type of device according with claim 1 wherein the said real boundary segments that act as evanescent decay attenuators have an effective refractive index lower than the effective index of the preferred mode.

3. A diode laser array type of device according with claim 2 wherein the said effective index of the said real boundary segments that act as evanescent decay attenuators is high enough to let higher order modes than the said preferred mode to leak out of the said segment structure.

* * * * *